United States Patent
Kojima

(10) Patent No.: US 9,184,352 B2
(45) Date of Patent: Nov. 10, 2015

(54) PHOSPHOR DISPERSION LIQUID, AND PRODUCTION METHOD FOR LED DEVICE USING SAME

(71) Applicant: Konica Minolta, Inc., Tokyo (JP)

(72) Inventor: Takeshi Kojima, Tokyo (JP)

(73) Assignee: KONICA MINOLTA, INC., Tokyo (JP)

( * ) Notice: Subject to any disclaimer, the term of this patent is extended or adjusted under 35 U.S.C. 154(b) by 0 days.

(21) Appl. No.: 14/349,172

(22) PCT Filed: Oct. 5, 2012

(86) PCT No.: PCT/JP2012/006415
§ 371 (c)(1),
(2) Date: Apr. 2, 2014

(87) PCT Pub. No.: WO2013/051280
PCT Pub. Date: Apr. 11, 2013

(65) Prior Publication Data
US 2015/0118773 A1    Apr. 30, 2015

(30) Foreign Application Priority Data

Oct. 7, 2011   (JP) ................................ 2011-222767
Feb. 16, 2012  (JP) ................................ 2012-031680

(51) Int. Cl.
| H01L 31/12 | (2006.01) |
| H01L 33/00 | (2010.01) |
| H01L 33/50 | (2010.01) |
| C09K 11/02 | (2006.01) |

(52) U.S. Cl.
CPC .............. *H01L 33/502* (2013.01); *C09K 11/02* (2013.01); *C09K 11/025* (2013.01); *H01L 33/501* (2013.01); *H01L 2933/0041* (2013.01)

(58) Field of Classification Search
CPC ................... H01L 21/02392; H01L 21/02461; H01L 21/02348; H01L 29/6603; H01L 51/525; H01L 51/5296
USPC ................. 257/15, 40, 79, 88, 292, 428, 759, 257/E21.006, E21.077, E21.053, E21.126, 257/E21.127, E21.267, E21.347, E21.352; 438/106, 141

See application file for complete search history.

(56) References Cited

U.S. PATENT DOCUMENTS

| 5,006,277 A | * | 4/1991 | Yoneshima et al. ..... 252/301.6 S |
| 6,462,352 B1 | * | 10/2002 | Matsumoto et al. ........ 250/582 |
| 7,795,625 B2 | * | 9/2010 | Suzuki ............................. 257/81 |
| 7,859,002 B2 | * | 12/2010 | Nagai et al. ..................... 257/98 |

(Continued)

FOREIGN PATENT DOCUMENTS

| JP | 2001-181614 A | 7/2001 |
| JP | 2003-115614 A | 4/2003 |
| JP | 2004-153109 A | 5/2004 |

(Continued)

*Primary Examiner* — David Nhu
(74) *Attorney, Agent, or Firm* — Lucas & Mercanti, LLP

(57) ABSTRACT

The purpose is to provide a phosphor particle dispersion liquid in which the phosphor particles do not settle out when the phosphor dispersion liquid is left to stand. The phosphor dispersion liquid contains phosphor particles, clay mineral particles, inorganic particles, and a solvent. The phosphor dispersion liquid has viscosity $\eta 1$ of 10 to 500 mPa·s at a shear rate of 1000 (1/s) at 25° C., and viscosity $\eta 2$ of $1.0 \times 10^3$ to $1.0 \times 10^5$ mPa·s at a shear rate of 1 (1/s) at 25° C.

13 Claims, 2 Drawing Sheets

(56) References Cited

U.S. PATENT DOCUMENTS

2009/0278147 A1  11/2009  Suzuki
2009/0302338 A1  12/2009  Nagai

FOREIGN PATENT DOCUMENTS

| JP | 2004-342782 A | 12/2004 |
|---|---|---|
| JP | 2007-145973 A | 6/2007 |
| JP | 2007-177035 A | 7/2007 |
| JP | 2009-170824 A | 7/2009 |
| JP | 2009-191091 A | 8/2009 |
| JP | 2010-500739 A | 1/2011 |
| JP | 2011-001418 A | 1/2011 |
| WO | WO2007/080803 A | 7/2007 |
| WO | WO2011/065322 A | 6/2011 |

\* cited by examiner

PHOSPHOR DISPERSION LIQUID, AND PRODUCTION METHOD FOR LED DEVICE USING SAME

CROSS REFERENCE TO RELATED APPLICATION

This Application is a 371 of PCT/JP2012/006415 filed on Oct. 5, 2012 which, in turn, claimed the priority of Japanese Patent Application No. JP2011-222767 filed on Oct. 7, 2011 and of Japanese Patent Application No. JP2012-031680 filed on Feb. 16, 2012, all applications are incorporated herein by reference.

TECHNICAL FIELD

The present invention relates to a phosphor dispersion liquid, and a method of manufacturing an LED device using the same.

BACKGROUND ART

Light-emitting devices using LED chips (LED devices) are finding wide applications because of demand for light-emitting devices with higher luminance and lower energy consumption. In particular, white LED devices are increasingly used as lighting sources such as electric lights, which require white light, and backlights for liquid crystal displays in the field of lighting devices.

An example of the white LED devices is a device that use a combination of a blue LED chip and a phosphor that emits yellow light upon receipt of blue light. Other examples of the white LED device include white LED devices that create white light by a combination of a LED chip that emits UV light and phosphors that emit, upon receipt of UV light, blue, green and red lights; and white LED devices that create white light by a combination of a LED chip that emits blue light and phosphors that emit red and green lights. In the above-mentioned white LED devices, the light emitted by the LED chip and the fluorescence emitted by the phosphor are mixed, thereby obtaining white light.

The white LED devices that use a combination of an LED chip and a phosphor can generate white light with a single light source (LED chip). Thus, as compared to white LED devices that use a combination of multiple LED chips of different colors for generation of white light, the device can be more simplified and power consumption can be reduced.

However, the light from white LED devices using a combination of an LED chip and a phosphor is colored when a balance between the emission light from the LED chip and fluorescence from the phosphor is disrupted. The disrupted balance also causes "color non-uniformity," a phenomenon where color (chromaticity) varies depending on the observation angle of the device.

One cause of light coloring and color non-uniformity pertinent in the white LED device is the non-uniform distribution of phosphors in the LED device. Generally, phosphors are dispersed in resin. Phosphor, however, is generally an inorganometallic compound having an extremely high specific gravity. Therefore, when liquid resin containing dispersed phosphor particles is applied, the phosphor particles settle down, resulting in that the phosphor particles are unevenly deposited.

One disclosed technique for reduced color non-uniformity of light emitted from the white LED device involves adding an anti-settling agent of phosphor particles to liquid resin thus preventing settling of the phosphor particles (see PTL 1). In PTL 1, application of the liquid resin containing the phosphor particles is followed by curing while spinning, thereby limiting settlement of the phosphor particles (see PTL 1).

In recent years, dispersion of phosphor particles to light transmissive ceramic (glass) has been studied. In this method, however, it is difficult to apply the dispersion liquid on the corners and lateral surfaces of the LED chip since the viscosity of the dispersion liquid containing dispersed phosphor particles is low. As a result, the wavelength conversion efficiency is easily degraded, and chromaticity deviation and color non-uniformity easily occur among different directions. Under such circumstances, a method has been proposed in which color non-uniformity is reduced by spraying a spiral of a coating solution containing a phosphor and a ceramic precursor (see PTL 2).

CITATION LIST

Patent Literature

PTL 1
Japanese Patent Application Laid-Open No. 2004-153109
PTL 2
Japanese Patent Application Laid-Open No. 2003-115614

SUMMARY OF INVENTION

Technical Problem

In recent years, white lighting apparatuses provided with multiple white LED devices have been developed. Such white lighting apparatuses are increasingly used in, for example, automobile lighting systems, which require high luminance, as well as in store lighting systems where chromaticity is given high priority. In such lighting apparatuses, it is becoming more important that the chromaticity levels are exactly consistent among different white LED devices.

Generally, an applicator such as a dispenser or a sprayer is used to apply phosphor dispersion liquid in which phosphors are dispersed. Such applicators allow for continuous manufacturing of multiple white LED devices. In the applicators, the phosphor dispersion liquid contained in a coating solution tank is supplied to a head of the applicator, and the phosphor dispersion liquid is discharged from a nozzle. However, when the phosphor dispersion liquid is kept in the coating solution tank, phosphor particles gradually settle down. As a result, the concentration of phosphor particles in the phosphor dispersion liquid supplied to the head differs between the initial stage and end stage of the application operation, and the chromaticity of emission light may differ among white LED devices when multiple LED devices are continuously manufactured.

Settling of phosphor particles in the coating solution tank may be prevented by increasing the viscosity of the phosphor dispersion liquid. When the composition is adjusted in order to increase the viscosity, however, the nozzle may be clogged. Further, when excessive pressure is applied at the time of discharging, non-uniform coating may be caused and/or the thickness of the coating may be non-uniform, and thus, coloring and color non-uniformity are easily caused.

Under such circumstances, an object of the present invention is to provide a phosphor dispersion liquid containing phosphors as a dispersoid, wherein even after the dispersion liquid is allowed to stand, settling of phosphors does not easily occur. Another object of the present invention is to facilitate discharging of the phosphor dispersion liquid from an applicator at the time of application.

Solution to Problem

The present invention provides first phosphor dispersion liquids set forth below.
[1] A phosphor dispersion liquid including phosphor particles, clay mineral particles, inorganic particles, and a solvent, the phosphor dispersion liquid having
viscosity $\eta 1$ of 10 to 500 mPa·s at a shear rate of 1,000 (1/s) at 25° C., and
viscosity $\eta 2$ of $1.0 \times 10^3$ to $1.0 \times 10^5$ mPa·s at a shear rate of 1 (1/s) at 25° C.
[2] The phosphor dispersion liquid according to [1], wherein the clay mineral particles are a laminar silicate mineral.
[3] The phosphor dispersion liquid according to [1] or [2], wherein the solvent includes a monohydric alcohol and a polyol.

The present invention relates to methods of manufacturing an LED device set forth below.
[4] A method of manufacturing an LED device, the LED device including a LED chip and a phosphor layer that covers the LED chip and converts light having a predetermined wavelength emitted from the LED chip into light having another predetermined wavelength, the method including:
providing the LED;
applying the phosphor dispersion liquid according to any one of [1] to [3] on the LED chip;
applying on the LED chip a binder precursor-containing liquid containing a light transmissive binder precursor; and
curing the light transmissive binder precursor.
[5] The method according to [4], wherein the light transmissive binder precursor is a light transmissive ceramic precursor.

The present invention relates to second phosphor dispersion liquids set forth below.
[6] A phosphor dispersion liquid including phosphor particles, clay mineral particles, inorganic particles, and a dispersion solvent containing water and an organic solvent, wherein
a content of the water is 0.1 wt % to 4 wt %.
[7] The phosphor dispersion liquid according to [6], wherein the phosphor dispersion liquid has a viscosity of 60 mPa·s to 400 mPa·s when the phosphor dispersion liquid is measured using a vibration viscometer at 25° C.
[8] The phosphor dispersion liquid according to [6] or [7], wherein the organic solvent includes a monohydric alcohol and a polyol.

The present invention provides methods of manufacturing an LED device set forth below.
[9] A method of manufacturing an LED device, including:
providing an LED chip; and
forming a phosphor layer by applying the phosphor dispersion liquid according to any one of [6] to [8] on an emission surface of the LED chip.
[10] The method according to [9], further including applying a solution including an organometallic compound on the emission surface of the LED chip.
[11] The method according to [9] or [10], wherein
the phosphor dispersion liquid is applied using a spray applicator, and
the spray applicator includes a coating solution tank for storing therein the phosphor dispersion liquid, a head having a nozzle for discharging the phosphor dispersion liquid, and a connector tube for allowing communication between the coating solution tank and the head.
[12] The method according to any one of [9] to [11], wherein the LED device is a white LED device.

The present invention also relates to third phosphor dispersion liquids set forth below.
[13] A phosphor dispersion liquid including phosphor particles, clay mineral particles, inorganic particles, and a solvent,
the solvent including water,
a content of the water being 0.1 wt % to 4 wt % of a total amount of the phosphor dispersion liquid,
the phosphor dispersion liquid having
viscosity $\eta 1$ of 10 to 500 mPa·s at a shear rate of 1,000 (1/s) at 25° C., and
viscosity $\eta 2$ of $1.0 \times 10^3$ to $1.0 \times 10^5$ mPa·s at a shear rate of 1 (1/s) at 25° C.

Advantageous Effect of Invention

The first phosphor dispersion liquids according to the present invention have a high viscosity when they are allowed to stand, in other words, when they are stored in the applicator, and the phosphor particles do not easily settle down. At the same time, the viscosity of the first phosphor dispersion liquids easily decrease when a certain pressure is applied thereto, and the first phosphor dispersion liquids can be easily discharged from the applicator. Thus, a phosphor layer of an LED device formed by applying the first phosphor dispersion liquids causes no coloring and color non-uniformity in the light emitted from the LED device. Further, the chromaticities of light emitted from multiple LED devices are consistent.

Likewise, the second phosphor dispersion liquids according to the present invention also do not easily cause settling of phosphors. Therefore, the phosphors can be kept uniformly dispersed for long periods of time also in the coating solution tank of the applicator of the phosphor dispersion liquid. Therefore, even when the application operation is performed over a prolonged period, the concentration of the phosphors in the dispersion liquid to be applied is not changed between the initial stage and end stage of the application operation. Thus, even when multiple LED devices are continuously manufactured using an applicator, the chromaticity of light is consistent between an LED device manufactured at the initial stage of the application operation, and an LED device manufactured at the end stage of the application operation.

Likewise, the third phosphor dispersion liquid according to the present invention has a high viscosity when it is allowed to stand, in other words, when it is stored in the applicator, and the phosphor particles do not easily settle down. Thus, even when multiple LED devices are continuously manufactured using an applicator, the chromaticity of light is consistent between an LED device manufactured at the initial stage of the application operation, and an LED device manufactured at the end stage of the application operation.

DESCRIPTION OF EMBODIMENTS

While the invention will be specifically described below, it is not intended to limit the present invention to a preferred embodiment but the present invention may be further modified within the scope of the gist.

The present invention relates to a phosphor dispersion liquid for forming a phosphor layer of an LED device, and to a method of manufacturing an LED device using the phosphor dispersion liquid.

1. LED Device

Figure 1:
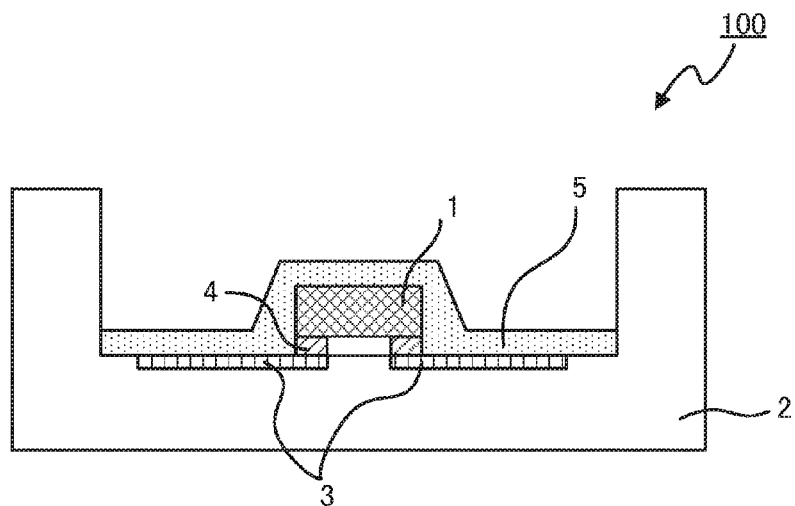
FIG. 1 is a schematic sectional view illustrating an exemplary configuration of an LED device of the present invention.

An LED device includes an LED chip and a phosphor layer that covers an emission surface of the LED chip and converts part of light having a predetermined wavelength emitted from the LED chip into light having another predetermined wavelength, wherein an optional protective layer and the like are provided on the phosphor layer. FIG. 1 is a schematic sectional view illustrating an exemplary configuration of LED device 100.

LED chip 1 is disposed on package (LED substrate) 2, and is connected to metal part (metal interconnection) 3 disposed on package 2 through bump electrodes 4 and the like.

LED chip 1 is a blue LED for example. The blue LED may be a layer sequence made up of an n-GaN compound semiconductor layer (cladding layer), an InGaN compound semiconductor layer (light emitting layer), a p-GaN compound semiconductor layer (cladding layer), and a transparent electrode layer which are laminated on package 2, or the like. LED chip 1 has an emission surface of 200 to 300 μm×200 to 300 μm, for example. LED chip 1 typically has a height of about 50 to 200 μm.

While package 2 is made of, for example, a liquid crystal polymer or ceramic, any material having an insulation property and heat resistance may be used. In addition, the form thereof is not particularly limited, and, as illustrated in FIG. 1, a form with a recess and a plate-shaped form may also be adopted.

Metal part 3 is an interconnection line made of metal such as silver, and may function as a reflection plate that reflects light emitted from LED chip 1 to a light coupling-out surface. Metal part 3 may be connected to LED chip 1 through bump electrodes 4 or the like as illustrated in FIG. 1, or may be connected to LED chip 1 through interconnection or the like. A configuration in which metal part 3 and LED chip 1 are connected through bump electrodes 4 is called flip-chip bonding.

While only one LED chip 1 is disposed on package 2 in LED device 100 illustrated in FIG. 1, multiple LED chips 1 may be disposed on package 2.

LED device 100 includes phosphor layer 5 that covers the emission surface of LED chip 1. Phosphor layer 5 contains therein phosphor particles. It suffices that phosphor layer 5 covers the emission surface of LED chip 1 (typically, the top surface of the LED chip), and phosphor layer 5 may cover lateral surfaces of LED chip 1 as illustrated in FIG. 1. While the thickness of phosphor layer 5 is not particularly limited, the thickness is preferably 15 μm to 300 μm, more preferably 20 to 100 μm.

Phosphor layer 5 emits fluorescence upon receipt of light (excitation light) emitted from LED chip 1. Mixing of excitation light with fluorescence causes the emission of light of desired color from LED device 100. That is, phosphor layer 5 functions as a wavelength conversion layer. For example, when LED chip 1 emits blue light and phosphor layer 5 emits yellow fluorescence, LED device 100 emits white light.

It is necessary that the phosphor particles uniformly present in phosphor layer 5. The reason for this is to obtain light having a desired color from LED device 100. The phosphor dispersion liquid of the present invention is intended to form phosphor layer 5.

Phosphor layer 5 contains therein phosphor particles, clay mineral particles, inorganic particles, a binder, and other optional components.

The amount of the phosphor particles contained in phosphor layer 5 is preferably 50 to 95 wt %. Sufficient fluorescence cannot be obtained when the amount of the phosphor particles is small. On the other hand, when the amount of the phosphor particles is excessive, the amount of the binder is relatively decreased, and the strength of phosphor layer 5 is decreased.

The binder of phosphor layer 5 may be light transmissive organic resin such as silicone resin, light transmissive ceramic such as glass, or the like. Binder is preferably light transmissive ceramic, from the perspective of increasing the heat resistance and the like of phosphor layer 5.

When the binder of phosphor layer 5 is light transmissive ceramic, the amount of the light transmissive ceramic in phosphor layer 5 is preferably 2 to 50 wt %, more preferably 2.5 to 30 wt %. When the amount of the light transmissive ceramic in phosphor layer 5 is less than 2 wt %, the strength of phosphor layer 5 decreases due to too little binder. On the other hand, when the amount of the light transmissive ceramic is greater than 50 wt %, the amount of the inorganic particles and/or the like relatively decreases. When the amount of the inorganic particles and/or the like relatively decreases, the strength of phosphor layer 5 decreases.

The amount of the clay mineral particles contained in phosphor layer 5 is preferably 0.5 to 20 wt %, more preferably 0.5 to 10 wt %. When the amount of the clay mineral particles contained in phosphor layer 5 is greater than 20 wt %, the strength of phosphor layer 5 is insufficient. On the other hand, when the amount of the clay mineral particles is less than 0.5 wt %, the amount of the clay mineral particles is small relative to the amount of the phosphor particles, and the viscosity of the phosphor dispersion liquid for forming phosphor layer 5 is low, and as a result, the phosphor particles easily settle down. This may result in non-uniformity of the phosphor particles in phosphor layer 5, and color non-uniformity and coloring of light emitted from the LED device.

The amount of the inorganic particles contained in phosphor layer 5 is preferably 0.5 to 50 wt %, more preferably 1 to 40 wt %. When the amount of the inorganic particles contained in phosphor layer 5 is less than 0.5 wt %, or greater than 50 wt %, the strength of phosphor layer 5 cannot be sufficiently increased.

Phosphor layer 5 may be covered by a protective layer. For example, when the binder of phosphor layer 5 is light transmissive ceramic, phosphor layer 5 may be covered by a protective layer made of silicone resin. Other optical components (e.g., lens) are further provided to LED device 100, and thus LED device 100 serves as various types of optical member.

2. Phosphor Dispersion Liquid

The phosphor dispersion liquid of the present invention is a composition for forming phosphor layer 5 in the above-described LED device. Phosphor layer 5 is obtained by applying on the LED chip the phosphor dispersion liquid and a binder precursor-containing liquid of the present invention. The binder to be combined may be organic resin or light transmissive ceramic.

The phosphor dispersion liquid of the present invention includes the following three types of phosphor dispersion liquid.

(i) A phosphor dispersion liquid which contains phosphor particles, clay mineral particles, inorganic particles and a solvent, and has viscosity $\eta1$ of 10 to 500 mPa·s at a shear rate of 1,000 (1/s) at 25° C., and viscosity $\eta2$ of $1.0\times10^3$ to $1.0\times10^5$ mPa·s at a shear rate of 1 (1/s) at 25° C.

(ii) A phosphor dispersion liquid which contains phosphor particles, clay mineral particles, inorganic particles, and a dispersion solvent containing water and an organic solvent, in which the water content is 0.1 to 4 wt %.

(iii) A phosphor dispersion liquid which contains phosphor particles, clay mineral particles, inorganic particles, and a solvent, where the solvent contains water, the water content is 0.1 to 4 wt % of the total amount of the phosphor dispersion liquid, and the phosphor dispersion liquid has viscosity $\eta1$ of 10 to 500 mPa·s at a shear rate of 1,000 (1/s) at 25° C., and viscosity $\eta2$ of $1.0\times10^3$ to $1.0\times10^5$ mPa·s at a shear rate 1 (1/s) at 25° C.

In each of the above-mentioned phosphor dispersion liquids, phosphors do not easily settle down.

2-1. First Phosphor Dispersion Liquid

A first phosphor dispersion liquid contains phosphor particles, clay mineral particles, inorganic particles, and a solvent. The first phosphor dispersion liquid may further contain optional additives.

Phosphor Particles

The phosphor particles contained in the first phosphor dispersion liquid is excited by the wavelength (excitation wavelength) of light emitted from the LED chip, and emits fluorescence having a wavelength different from the excitation wavelength. In the case of an LED chip which emits blue light, white light can be obtained by employing phosphor particles that emit yellow fluorescence. Examples of the phosphors that emit yellow fluorescence include YAG (yttrium-aluminum-garnet) phosphor. YAG phosphor can emit fluorescence of yellow light (550 to 650 nm wavelength) upon receipt of blue light (420 to 485 nm wavelength) emitted from the blue LED chip.

The phosphor particles are produced for example by the method including: 1) mixing as flux an appropriate amount of fluoride such as ammonium fluoride with a mixed raw material having a predetermined composition followed by pressing to produce a molded article; and 2) loading the molded article into in a crucible followed by calcination in air at 1,350 to 1,450° C. for 2 to 5 hours to produce a sintered product.

The mixed raw material having a predetermined composition can be produced by fully mixing stoichiometric ratios of oxides of Y, Gd, Ce, Sm, Al, La and Ga or compounds that are easily converted to the oxides at elevated temperatures. Alternatively, the mixed raw material having a predetermined composition can be produced by mixing a coprecipitate oxide, aluminum oxide and gallium oxide, wherein the coprecipitate oxide is one produced by calcining a coprecipitate obtained using oxalic acid from a solution containing stoichiometric ratios of the rare earth elements Y, Gd, Ce and Sm in acid.

The phosphor particles are not limited to YAG phosphors; other phosphors, including Ce-free, non-garnet phosphor, can also be employed. Examples of preferable phosphor particles include silicate phosphors, nitride phosphors, oxynitride phosphors, sulfide phosphors, thiogallate phosphors, and aluminate phosphors.

The mean particle diameter of the phosphor particles is preferably 1 to 50 μm. Luminescence efficiency (conversion efficiency) increases as the phosphor particle diameter increases. On the other hand, when the particle diameter of the phosphor particles is too large, the gaps in the phosphor layer that occur between the phosphor particle and binder become large enough to cause a reduction in strength of the phosphor layer. The mean particle diameter of the phosphor particles can be measured for example by the Coulter counter method.

The amount of the phosphor particles is preferably 10 to 70 wt %, more preferably 30 to 60 wt %, of the total amount of the first phosphor dispersion liquid. When the amount of the phosphor particles is small, the amount of the phosphors contained in the phosphor layer is small, and fluorescence cannot be sufficiently obtained. On the other hand, when the amount of the phosphor particles is excessive, the phosphor particles easily settle down in the first phosphor dispersion liquid.

Clay Mineral Particles

When the first phosphor dispersion liquid contains clay mineral particles, the viscosity of the phosphor dispersion liquid increases, and the settling of the phosphor is reduced. Examples of the clay mineral particles include laminar silicate mineral, imogolite, and allophane, with the laminar silicate mineral being preferable. The laminar silicate mineral is preferably a swelling clay mineral having mica structure, kaolinite structure, or smectite structure, more preferably a swelling clay mineral having smectite structure, which exhibits good swelling property.

Laminar silicate minerals easily form the card house structure when the phosphor dispersion liquid is allowed to stand. When laminar silicate minerals form the card house structure, the viscosity of the phosphor dispersion liquid considerably increases. On the other hand, the card house structure easily collapses when a certain pressure is applied, and in such case, the viscosity of the phosphor dispersion liquid decreases. In other words, when the phosphor dispersion liquid contains laminar silicate minerals, the viscosity of the phosphor dispersion liquid is high when the liquid is allowed to stand, while the viscosity of the phosphor dispersion liquid is low when certain pressure is applied.

Examples of the laminar silicate minerals include, natural or synthetic, smectite clay minerals such as hectorite, saponite, stevensite, beidellite, montmorillonite, nontronite, and bentonite, swelling mica clay minerals such as Na tetrasilicic-fluorinemica, Li tetrasilicicfluorinemica, Na fluorine taeniolite, Li fluorine taeniolite and the like, vermiculite and kaolinite, and mixtures thereof.

Examples of commercially available clay mineral particles include: Laponite XLG (synthetic hectorite analogue available from LaPorte Co., UK); Laponite RD (synthetic hectorite analogue available from LaPorte Co., UK); Samabisu (synthetic hectorite analogue available from Henkel, Germany); Sumecton SA-1 (saponite analogue available from KUNIMINE Industry Co., Ltd.); BEN-GEL (natural bentonite available from Hojun Corporation); Kunipia F (natural montmorillonite available from KUNIMINE Industry Co., Ltd.); Veegum (natural hectorite available from Vanderbilt Co., Ltd, US); Daimonaito (synthetic swelling mica available from Topy Industries Ltd.); Somasif (synthetic swelling mica available from CO-OP CHEMICAL CO., LTD.); SWN (synthetic smectite available from CO-OP CHEMICAL CO., LTD.); and SWF (synthetic smectite available from CO-OP CHEMICAL CO., LTD.).

The amount of the clay mineral particles is preferably 0.1 to 5 wt %, more preferably 2 to 5 wt %, of the total amount of the first phosphor dispersion liquid. When the amount of the clay mineral particles is small, the viscosity of the first phosphor dispersion liquid is not easily increased when the first phosphor dispersion liquid is allowed to stand. Therefore, the phosphor particles easily settle down when the first phosphor dispersion liquid is allowed to stand. On the other hand, when the amount of the clay mineral particles is excessive, the viscosity of the phosphor dispersion liquid is kept at a high level even when a certain pressure is applied. Therefore, the first phosphor dispersion liquid may not be uniformly discharged from the applicator.

The surface of the clay mineral particles may be modified (surface treated) with ammonium salt and/or the like in consideration of compatibility with the solvent in the first phosphor dispersion liquid.

Inorganic Particles

When the first phosphor dispersion liquid contains inorganic particles, the gaps formed at the interfaces between the phosphor particles and the clay mineral particles are filled, and the viscosity of the phosphor dispersion liquid is increased.

Examples of the inorganic particles include oxide particles of silicon oxide, aluminum oxide, zirconium oxide, titanium oxide or zinc oxide, fluoride particles of magnesium fluoride, and their mixtures. The inorganic particles are preferably oxide particles. In particular, when the binder in the phosphor layer is a cured product (ceramic) of a silicon-containing organic compound such as polysiloxane, it is preferable to employ silicon oxide particles from the perspective of stability with respect to the binder of the phosphor layer.

The amount of the inorganic particles in the first phosphor dispersion liquid is preferably 1 to 40 wt % of the total amount of the phosphor dispersion liquid. When the amount of the inorganic particles is greater than 40 wt %, the viscosity of the phosphor dispersion liquid is kept at a high level even when a certain pressure is applied, and the phosphor dispersion liquid may not be uniformly discharged from the applicator. On the other hand, when the amount of the inorganic particles is less than 1%, the viscosity of the phosphor dispersion liquid is low.

The mean particle diameter of the inorganic particles is preferably 0.001 to 50 μm, from the perspective of filling the gaps formed at the interfaces between the phosphor particles and the clay mineral particles. The mean particle diameter of the inorganic particles can be measured for example by the Coulter counter method.

The surface of the inorganic particles may be treated with a silane coupling agent or a titanium coupling agent. Surface treatment increases the compatibility of the inorganic particles with the solvent.

Solvent

While the solvent contained in the first phosphor dispersion liquid is not particularly limited as long as phosphor particles, clay mineral particles, and inorganic particles can be uniformly dispersed therein, a solvent whose boiling point is 250° C. or below is preferable. The reason for this is to facilitate drying of the solvent from the dispersion solution. When the boiling point is too high, evaporation of the dispersion solvent is slow, so that the phosphors present in the coating formed from the applied dispersion solution undesirably flow.

The solvent preferably contains a monohydric alcohol and a polyol having more than one hydroxyl group. When a monohydric alcohol is contained, the viscosity of the phosphor dispersion liquid easily decreases when a certain pressure is applied, and the phosphor dispersion liquid is easily discharged from the applicator. Examples of the monohydric alcohol include methanol, ethanol, propanol, and butanol. The amount of the monohydric alcohol is preferably 10 to 50 wt %, more preferably 20 to 50 wt %, of the total amount of the phosphor dispersion liquid.

On the other hand, when a polyol is contained, the viscosity of the phosphor dispersion liquid is easily increased, and the phosphor particles do not easily settle down when the phosphor dispersion liquid is allowed to stand. The polyol may be diol or triol. Examples of the polyol include ethylene glycol, propylene glycol, diethylene glycol, glycerin, 1,3-butanediol, and 1,4-butanediol, and among them, ethylene glycol, propylene glycol, 1,3-butanediol, 1,4-butanediol and the like are preferable. The polyol content is preferably 10 to 60 wt %, more preferably 20 to 50 wt %, of the total amount of the phosphor dispersion liquid.

The solvent of the first phosphor dispersion liquid may contain water. The presence of water in the first phosphor dispersion liquid results in swelling of the clay mineral particles due to entry of the water between layers of the clay mineral particles and thus the viscosity of the phosphor dispersion liquid more easily increases.

The water content in the first phosphor dispersion liquid is preferably 0.1 to 4 wt %, more preferably 0.5 to 2 wt %, of the total amount of the phosphor dispersion liquid. When the water content is small, the clay mineral particles may not sufficiently swell. On the other hand, when the water content in the phosphor dispersion liquid is too high, the wettability of the phosphor dispersion liquid decreases. This makes it difficult to form a uniform coating when the phosphor dispersion liquid is applied on a coating surface (emission surface of the LED chip).

The total amount of the solvent contained in the first phosphor dispersion liquid is appropriately set in accordance with the viscosity of the entire phosphor dispersion liquid. Normally, the total amount of the solvent contained in the phosphor dispersion liquid is preferably 30 to 90 wt %, more preferably 40 to 70 wt %, of the total amount of the phosphor dispersion liquid.

Method of Producing First Phosphor Dispersion Liquid

The first phosphor dispersion liquid is produced by adding to the solvent, phosphor particles, clay mineral particles and inorganic particles, and where necessary, optional additional additives to produce a mixture, and stirring the mixture.

Stirring of the mixture can be carried out using for example a stirrer mill, a blade kneader, or a thin-film spin dispersing machine. By adjusting the stirring conditions, the viscosity of the phosphor particles in the phosphor dispersion liquid can be adjusted.

Any of the stirring devices known in the art can be employed for the production of the phosphor dispersion solution. Examples include media-less stirring devices such as ULTRA-TURRAX (IKA Co., Ltd), T.K. Auto Homomixer (Primix Co., Ltd.), T.K. Pipeline Homomixer (Primix Co., Ltd.), T.K. FilMix (Primix Co., Ltd.), Cleamix (M Technique Co., Ltd.), Clea SS5 (M Technique Co., Ltd.), Cavitron (Eurotech Co., Ltd.), and Fine Flow Mill (Taiheiyo Kiko K.K.); media stirring devices such as Viscomill (Imex Co., Ltd.), Apex Mill (Kotobuki Industries Co., Ltd.), Star Mill (Ashizawa Fine Tech Co., Ltd.), DCP Super Flow (Nippon Eirich K.K.), MP Mill (Inoue, Ltd.), Spike Mill (Inoue, Ltd.), Mighty Mill (Inoue, Ltd.), and SC mill (Mitsui Kozan K.K.); and high-pressure atomizers such as Ultimizer (Sugino Machine K.K.), Nanomizer (Yoshida Kogyosha Co., Ltd.), and NANO3000 (Beryu Co., Ltd.) In addition, preferable examples include ultrasonic wave dispersion apparatuses.

Since phosphor particles are extremely hard particles, it is preferable to avoid abrasion at the part where the stirring device and the phosphor dispersion liquid make contact with each other, and entering of the resulting abrasion powder. To be more specific, the part where the stirring device and the phosphor dispersion liquid make contact with each other is made of a material such as a ceramic such as titania, zirconia, alumina or the like, or silicon carbide. In addition, the part making contact with the liquid is preferably coated with titanium oxide, chromium nitride, or diamond-like carbon.

Viscosity of First Phosphor Dispersion Liquid

The first phosphor dispersion liquid has viscosity η1 of 10 to 500 mPa·s at a shear rate of 1,000 (1/s) at 25° C. Viscosity η1 is preferably 50 to 300 mPa·s, more preferably 100 to 250 mPa·s. When viscosity η1 is too low, the coating easily flows, and the desired thickness of the phosphor layer cannot be easily obtained. On the other hand, when viscosity η1 is too high, the discharge port of the applicator may be clogged, and an excessive pressure may be required for discharging at the time of discharging from the applicator. This may result in uneven thickness of the coating, and/or non-uniform concentration of the phosphor particles in the coating.

Viscosity η1 of the first phosphor dispersion liquid can be adjusted by the kinds of the solvent in the phosphor dispersion liquid, the amount of the clay mineral particles and the like. For example, when the amount of monohydric alcohol in phosphor dispersion liquid is large, viscosity ill is low. On the other hand, when the amount of polyol is large, viscosity η1 is high. In addition, when the amount of the clay mineral particles is large, viscosity η1 is high.

The first phosphor dispersion liquid has viscosity η2 of $1.0 \times 10^3$ to $1.0 \times 10^5$ mPa·s at a shear rate of 1 (1/s) at 25° C. Viscosity η2 is preferably 5,000 to $5.0 \times 10^4$ mPa·s, more preferably $1.0 \times 10^4$ to $2.0 \times 10^4$ mPa·s. When viscosity η2 is too low, the phosphor particles settle down when the phosphor dispersion liquid is allowed to stand, in other words, when the phosphor dispersion liquid is stored in the applicator. As a result, the concentration of the phosphor particles in the phosphor dispersion liquid supplied from the applicator changes between the initial stage and end stage of the application operation, and the chromaticity of emission light may differ among the LED devices when multiple LED devices are continuously manufactured. On the other hand, when viscosity η2 is too high, the fluidity in the applicator is low, and the phosphor dispersion liquid may not be sent to the discharge port, and the liquid may not be discharged due to the clogged nozzle.

Viscosity η2 of the first phosphor dispersion liquid is increased by prolonging the stirring time at the time of producing the phosphor dispersion liquid, or by increasing the pressure exerted on the phosphor dispersion liquid at the time of stirring. The reason for this is that prolonging the stirring time and/or increasing the pressure at the time of stirring micronize the clay mineral particles contained in the phosphor dispersion liquid, and thus more card house structures are formed in the phosphor dispersion liquid. Viscosity η2 is also increased by stirring and mixing the phosphor particles, clay mineral particles, and inorganic particles in a small amount of solvent, and diluting the resulting mixture with a solvent, at the time of producing the phosphor dispersion liquid. When the phosphor particles, clay mineral particles, and inorganic particles are stirred and mixed at a high concentration, strong shearing force is applied to the particles and the particles are rubbed against each other. Consequently, the clay mineral particles are easily micronized, and a large number of card house structures are formed. In addition, when this method is used to produce phosphor dispersion liquid, phosphor particles easily adhere to clay mineral particles and inorganic particles, and easily and uniformly disperse together with the clay mineral particles and the inorganic particles.

Figure 2:
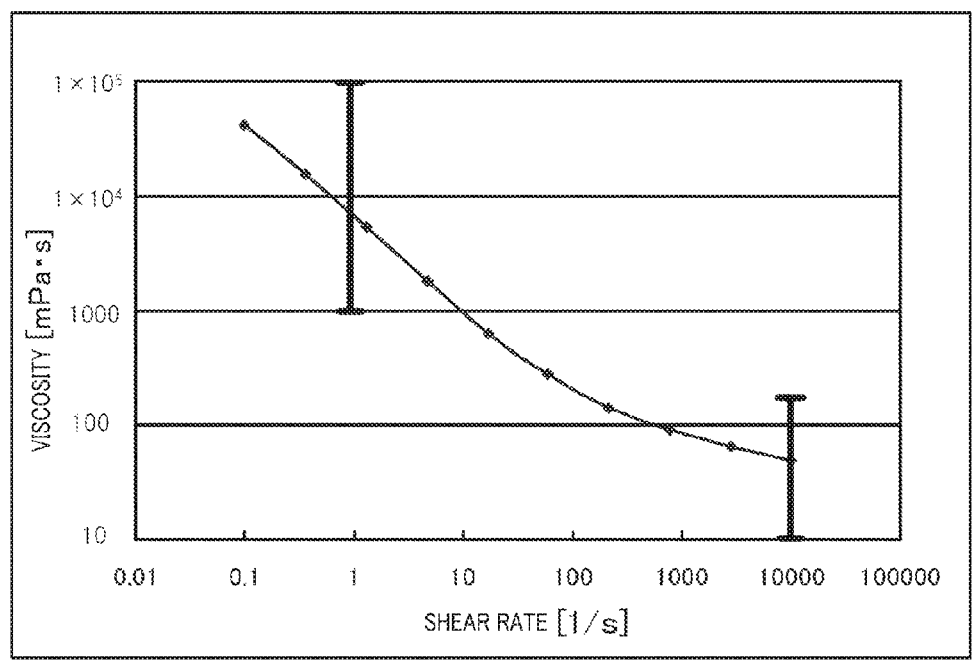
FIG. 2 is a graph illustrating an exemplary relationship between a shear rate and a viscosity based on a viscosity measurement of a first phosphor dispersion liquid of the present invention.

The viscosity of the first phosphor dispersion liquid at 25° C. is measured with RheoStress RS600 available from Haake, Inc., under the following condition. A parallel plate sensor having a diameter of 60 mm is used and a gap (the space between upper and lower plates) is adjusted to 0.15 mm. The amount of the sample per measurement is 2 cc, and, in the flow curve mode, shear rates are measured at ten points at even intervals from a shear rate of 0.1 (1/s) as the starting point to a shear rate of 100,000 (1/s). The retention time at each shear rate (the period from the change of the shear rate until the restart of the measurement) is one minute. Viscosity η1 at a shear rate of 1,000 (1/s), and viscosity η2 at a shear rate of 1 (1/s) are found from a graph obtained by plotting shear rates and viscosities, and employed as measurement values. FIG. 2 illustrates a relationship between the viscosity and the shear rate, which is obtained by measuring the viscosity of the phosphor dispersion liquid of the present invention. As illustrated in FIG. 2, in the phosphor dispersion liquid of the present invention, viscosity η1 at the shear rate of 1,000 (1/s), and viscosity η2 at the shear rate of 1 (1/s) fall within respective predetermined ranges.

2-2. Second Phosphor Dispersion Liquid

A second phosphor dispersion liquid contains a dispersion solvent containing water and an organic solvent, phosphor particles, clay mineral particles and inorganic particles, dispersed in a dispersion solvent. The first phosphor dispersion liquid may further contain optional additives. The phosphor particles, clay mineral particles, and inorganic particles contained in the second phosphor dispersion liquid may be the same as those contained in the above-described first phosphor dispersion liquid.

Dispersion Solvent

The dispersion solvent in the second phosphor dispersion liquid contains water and an organic solvent. The presence of water in the second phosphor dispersion liquid results in swelling of the clay mineral particles due to entry of the water between layers of the clay mineral particles and thus the viscosity of the phosphor dispersion liquid more easily increases.

The water content in the second phosphor dispersion liquid is preferably 0.1 to 4 wt %, more preferably 0.5 to 2 wt %, of the total amount of the phosphor dispersion liquid. When the water content is small, settling of the phosphors easily occurs. As a result, the phosphors in the phosphor dispersion liquid settle down during the application operation, and the concentration of the phosphors of the applied phosphor dispersion liquid may be changed between the initial stage and end stage of the application operation.

When the water content in the phosphor dispersion liquid is too large, the wettability of the phosphor dispersion liquid decreases. This makes it difficult to form a uniform coating when the phosphor dispersion liquid is applied on a coating surface (emission surface of the LED chip).

The organic solvent in the second phosphor dispersion liquid preferably contains alcohol. The alcohol may be a monohydric alcohol such as methanol, ethanol, propanol or butanol or may be a polyol having more than one hydroxyl group.

The organic solvent in the second phosphor dispersion liquid preferably contains both of a monohydric alcohol and a polyol having more than one hydroxyl group. The use of alcohols having more than one hydroxyl group as the dispersion solvent allows for an easy increase in viscosity of the phosphor dispersion liquid, thus easily preventing the settling of the phosphor particles, which are a dispersoid. The use of a monohydric alcohol as the dispersion solvent increases the drying speed of the coating, thus enhancing productivity.

The boiling point of the dispersion solvent is preferably 250° C. or below. The reason for this is to facilitate drying of the solvent from the dispersion solution. When the boiling point is too high, evaporation of the dispersion solvent is slow, so that the phosphors present in the coating formed from the applied dispersion solution undesirably flow.

For the polyol having more than one hydroxyl group, any polyol can be used as long as it can be used as solvent. Examples of usable polyols include ethylene glycol, propylene glycol, diethylene glycol, glycerol, 1,3-butanediol, and 1,4-butanediol, with ethylene glycol, propylene glycol, 1,3-butanediol, 1,4-butanediol and the like being preferable.

The viscosity of the second phosphor dispersion liquid measured at 25° C. by a vibration viscometer is normally 10 to 1,000 mPa·s, preferably 12 to 500 mPa·s, more preferably 20 to 400 mPa·s, still more preferably 60 to 400 mPa·s. When the viscosity is low, the phosphor particles in the phosphor dispersion liquid easily settle down thus shortening the time it takes before a supernatant layer is generated. On the other hand, when the viscosity is too high, application of the phosphor dispersion liquid, particularly application using a sprayer, becomes difficult.

Method of Producing Second Phosphor Dispersion Liquid

The second phosphor dispersion liquid is produced by adding to the dispersion solvent, phosphor particles, clay mineral particles and inorganic particles, and where necessary, optional additional additives to produce a mixture, and stirring the mixture. The stirring method of the mixture and the stirring device may be the same as the stirring method and the stirring device of the first phosphor dispersion liquid.

2-3. Third Phosphor Dispersion Liquid

A third phosphor dispersion liquid contains phosphor particles, clay mineral particles, inorganic particles, and a solvent, where the solvent contains water. The phosphor particles, clay mineral particles, and inorganic particles contained in the third phosphor dispersion liquid may be the same as those contained in the above-described first phosphor dispersion liquid. The solvent may be the same as the dispersion solvent in the second phosphor dispersion liquid.

Viscosity of Third Phosphor Dispersion Liquid

The third phosphor dispersion liquid has viscosity $\eta 1$ of 10 to 500 mPa·s at a shear rate of 1,000 (1/s) at 25° C. Viscosity $\eta 1$ is preferably 50 to 300 mPa·s, more preferably 100 to 250 mPa·s. When viscosity $\eta 1$ is too low, the coating easily flows, and the desired thickness of the phosphor layer cannot be easily obtained. On the other hand, when viscosity $\eta 1$ is too high, the discharge port of the applicator may be clogged, and an excessive pressure may be required for discharging at the time of discharging from the applicator. This may result in uneven thickness of the coating, and/or non-uniform concentration of the phosphor particles in the coating.

The third phosphor dispersion liquid has viscosity $\eta 2$ of $1.0 \times 10^3$ to $1.0 \times 10^5$ mPa·s at a shear rate of 1 (1/s) at 25° C. Viscosity $\eta 2$ is preferably 5,000 to $5.0 \times 10^4$ mPa·s, more preferably $1.0 \times 10^4$ to $2.0 \times 10^4$ mPa·s. When viscosity $\eta 2$ is too low, the phosphor particles settle down when the phosphor dispersion liquid is allowed to stand, in other words, when the phosphor dispersion liquid is stored in the applicator. As a result, the concentration of phosphor particles in the phosphor dispersion liquid supplied from the applicator changes between the initial stage and end stage of the application operation, and the chromaticity of emission light may differ among the LED devices when multiple LED devices are continuously manufactured. On the other hand, when viscosity $\eta 2$ is too high, the fluidity in the applicator is low, and the phosphor dispersion liquid may not be sent to the discharge port, and the liquid may not be discharged due to the clogged nozzle.

The measuring method and the adjusting method of the viscosity of the third phosphor dispersion liquid may be the same as those of the first phosphor dispersion liquid.

2-4. Method of Applying Phosphor Dispersion Liquid

All of the above-described phosphor dispersion liquids are preferably applied at a certain pressure. By applying a certain pressure at the time of application of phosphor dispersion liquid, the card house structure formed by the clay mineral particles is collapsed, whereby the phosphor dispersion liquid having low viscosity can be applied. Examples of preferable application methods include various kinds of spray methods such as a micro-spray method and an ultrasonic-spray method, various kinds of dispensing methods using a dispenser, a jet dispenser or the like, ink-jet method, bar-coating method, spin coating method, dip-coating method and the like. Among them, the spray methods and dispensing methods are preferable since the phosphor dispersion liquid can be continuously applied.

Figure 3:
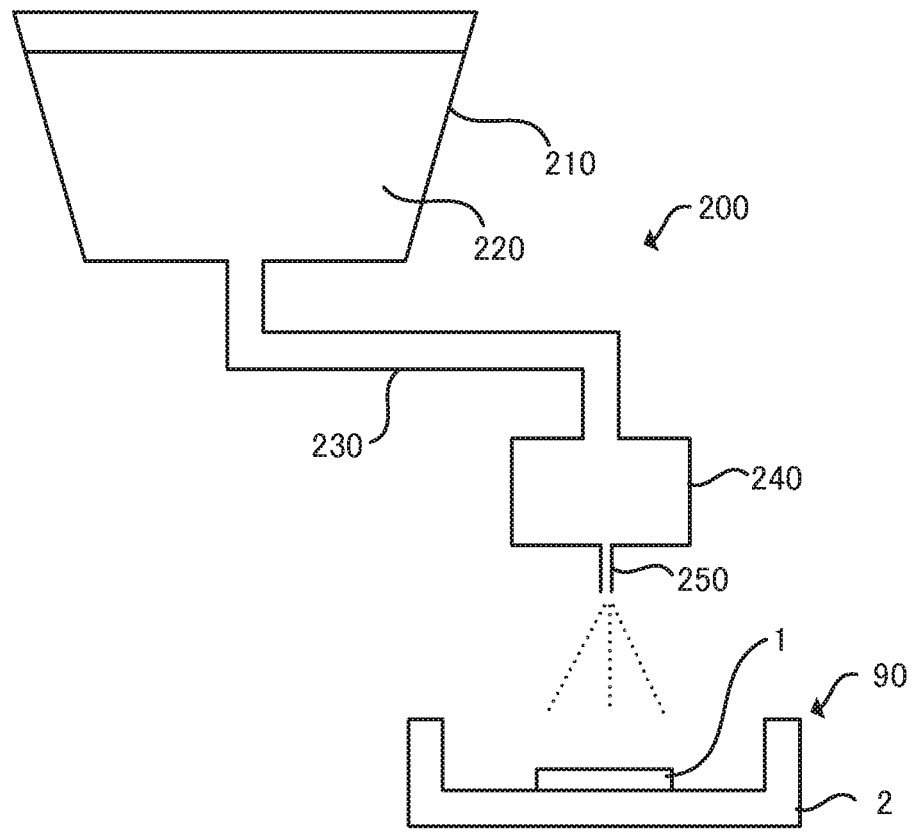
FIG. 3 is a schematic sectional view illustrating an exemplary sprayer for applying a phosphor dispersion liquid or binder precursor-containing liquid in a method of manufacturing an LED device of the present invention.

FIG. 3 schematically illustrates a sprayer which can be used to apply the phosphor dispersion liquid. Applicator 200 preferably includes coating solution tank 210 for storing therein coating solution (phosphor dispersion liquid) 220, head 240 having nozzle 250 for discharging coating solution 220, and connector tube 230 that allows for communication between coating solution tank 210 and nozzle 240.

Coating solution 220 in coating solution tank 210 of applicator 200 illustrated in FIG. 3 is pressurized and supplied through connector tube 230 to head 240. Coating solution 220 supplied to head 240 is discharged from nozzle 250 and applied on a coating target (LED chip). For a spray applicator, discharging of the coating solution from nozzle 250 is carried out by means of wind pressure. Nozzle 250 may have an openable and closable port at the tip so that the discharging operation is started or stopped by opening or closing the port.

Conventionally, phosphor particles dispersed in coating solution 220 contained in coating solution tank 210 may gradually settle down as time elapses at the time of application operation. This is because phosphor particles have a high specific gravity. When the phosphor particles settle down, the concentration of the phosphor particles in coating solution 220 to be supplied to head 240 changes, and the concentration of the phosphor particles in coating solution 220 to be applied from head 240 to an LED chip also changes. As a result, the chromaticity of light emitted from the LED device at the initial stage of the application operation differs from the chromaticity of light emitted from the LED device at the end stage of the application operation, which results in variation in chromaticity of light emitted from the manufactured LED devices.

In the phosphor dispersion liquid of the present invention, by contrast, phosphor particles do not easily settle down and are easily kept dispersed uniformly. Thus, even when stored for a long time in coating solution tank 210 of applicator 200, the phosphor particles in the phosphor dispersion liquid are kept dispersed uniformly. As a result, the concentration of the phosphors in the phosphor dispersion liquid to be applied on the application target is not changed between the initial stage and end stage of the application operation.

In addition, when a certain pressure is applied to the phosphor dispersion liquid of the present invention, the viscosity of the phosphor dispersion liquid decreases, whereby the phosphor dispersion liquid can be uniformly applied from nozzle 250 to the emission surface of LED chip 1. Consequently, non-uniform application of the phosphor particles is prevented, and coloring and/or color non-uniformity of the light emitted from the LED devices do not occur.

3. Method of Manufacturing LED Device

The LED device may be produced by a process including the steps of: providing an LED chip; applying the above-described phosphor dispersion liquid on the emission surface of the LED chip; applying a binder precursor-containing liquid containing a light transmissive binder precursor on the emission surface of the LED chip; and curing the light transmissive binder precursor.

The step of providing an LED chip may be a step in which LED chip 1 is mounted to package 2 to provide LED chip package 90 (see FIG. 3).

In the phosphor dispersion liquid applying step and the binder precursor applying step, the phosphor dispersion liquid and binder precursor-containing liquid are applied to the emission surface of LED chip 1 of LED chip package 90. The order of applying the phosphor dispersion liquid and the binder precursor-containing liquid is not limited, and they may be simultaneously applied. Alternatively, the application may be repeated for each of the phosphor dispersion liquid and binder solution. The methods of applying the phosphor dispersion liquid and the binder precursor-containing liquid may be the same as the above-described method of applying the phosphor dispersion liquid.

In the curing step, the light transmissive binder precursor in the binder precursor-containing liquid is cured after the application of the phosphor dispersion liquid and the binder precursor-containing liquid. By curing the light transmissive binder precursor in the curing step, phosphor layer 5 in which the phosphor particles are dispersed in the light transmissive binder can be obtained. The method of curing the light transmissive binder precursor is appropriately selected in accordance with the kind of the light transmissive binder precursor. For example, when the light transmissive binder precursor is thermosetting resin or light transmissive ceramic precursor, the curing step may be a step in which the light transmissive binder precursor is cured by heat.

[Binder Precursor-containing Liquid]

The binder precursor-containing liquid contains a light transmissive binder precursor. The type of the light transmissive binder precursor is not limited. The light transmissive binder precursor may be a precursor of a light transmissive resin such as silicone resin or epoxy resin, or a light transmissive ceramic precursor such as an organometallic compound. From the perspective of the heat resistance of the binder to be formed, the light transmissive binder precursor is preferably a light transmissive ceramic precursor.

Examples of the organometallic compound as the light transmissive ceramic precursor include compounds which are converted into transparent ceramic (preferably glass ceramic) by the sol-gel reaction. Examples of the organometallic compound include metal alkoxides, metal acetylacetonates, and metal carboxylates, with metal alkoxides, which are prone to gelation by hydrolysis and polymerization, being preferable. The type of metal in the metal alkoxides is not particularly limited as long as translucent ceramic can be formed, and different types of organometallic compounds may be combined. The metal alkoxides preferably contain silicon from the perspective of stability and production easiness of glass ceramic to be formed.

The metal alkoxide contained in the binder precursor-containing liquid may be a single molecule such as tetraethoxysilane or may be a polysiloxane in which organosiloxane moieties are linked either linearly or cyclically; polysiloxanes can increase the viscosity of the binder solution.

Polysiloxane is obtained by polymerizing alkoxysilane. Alkoxysilane is represented by for example the following general formula (I):

$$Si(OR)_n Y_{4-n} \qquad (I).$$

In general formula (I), n represents the number of alkoxide (OR), and is an integer of 2 to 4. Each R independently represents alkyl or phenyl, preferably $C_{1-5}$ alkyl or $C_{1-5}$ phenyl.

In the general formula (I), Y represents hydrogen or alkyl. The alkyl is an aliphatic group, alicyclic group, aromatic group or alicyclic aromatic group having 1 to 1,000, preferably 1 to 500, more preferably 1 to 100, still more preferably 1 to 50, and yet more preferably 1 to 6 carbon atoms. They may have a linking group consisting of an atom or atomic group of O, N, S and the like. Among them, methyl group is preferable. When Y is methyl group, favorable light resisting property and heat resistance of the phosphor layer are obtained.

The monovalent organic group represented by Y in general formula (I) may have a substituent. Examples of the substituent include halogens such as F, Cl, Br and I; and organic functional groups such as vinyl group, methacryloxy group, acryloxy group, styryl group, mercapto group, epoxy group, epoxycyclohexyl group, glycidoxy group, amino group, cyano group, nitro group, sulfonate group, carboxy group, hydroxy group, acyl group, alkoxy group, imino group, and phenyl group.

The alkoxysilane represented by general formula (I) may be the following tetrafunctional silane compound, trifunctional silane compound, bifunctional silane compound or the like.

Examples of the tetrafunctional silane compound include: tetraalkoxysilanes such as tetramethoxysilane, tetraethoxysilane, tetrapropoxysilane, tetrabutoxysilane, tetrapentyloxysilane, tetraphenyoxysilane, trimethoxymonoethoxysilane, dimethoxydiethoxysilane, triethoxymonomethoxysilane, trimethoxymonopropoxysilane, monomethoxytributoxysilane, monomethoxytripentyloxysilane, monomethoxytriphenyloxysilane, dimethoxydipropoxysilane, tripropoxymonomethoxysilane, trimethoxymonobutoxysilane, dimethoxydibutoxysilane, triethoxymonopropoxysilane, diethoxydipropoxysilane, tributoxymonopropoxysilane, dimethoxymonoethoxymonobutoxysilane, diethoxymonomethoxymonobutoxysilane, diethoxymonopropoxymonobutoxysilane, dipropoxymonomethoxymonoethoxysilane, dipropoxymonomethoxymonobutoxysilane, dipropoxymonoethoxymonobutoxysilane, dibutoxymonomethoxymonoethoxysilane, dibutoxymonoethoxymonopropoxysilane, and monomethoxymonoethoxymonopropoxymonobutoxysilane. Among them, tetramethoxysilane and tetraethoxysilane are preferable.

Examples of the trifunctional silane compound include monohydrosilane compounds such as trimethoxysilane, triethoxysilane, tripropoxysilane, tripentyloxysilane, triphenyloxysilane, dimethoxymonoethoxysilane, diethoxymonomethoxysilane, dipropoxymonomethoxysilane, dipropoxymonoethoxysilane, dipentyloxylmonomethoxysilane, dipentyloxymonoethoxysilane, dipentyloxymonopropoxysilane, diphenyloxylmonomethoxysilane, diphenyloxymonoethoxysilane, diphenyloxymonopropoxysilane, methoxyethoxypropoxysilane, monopropoxydimethoxysilane, monopropoxydiethoxysilane, monobutoxydimethoxysilane, monopentyloxydiethoxysilane, and monophenyloxydiethoxysilane; monomethylsilane compounds such as methyltrimethoxysilane, methyltriethoxysilane, methyltripropoxysilane, methyltripentyloxysilane, methylmonomethoxydiethoxysilane, methylmonomethoxydipropoxysilane, methylmonomethoxydipentyloxysilane, methylmonomethoxydiphenyloxysilane, methylmethoxyethoxypropoxysilane, and methylmonomethoxymonoethoxymonobutoxysilane; monoethylsilane compounds such as ethyltrimethoxysilane, ethyltripropoxysilane, ethyltripentyloxysilane, ethyltriphenyloxysilane, ethylmonomethoxydiethoxysilane, ethylmonomethoxydipropoxysilane, ethylmonomethoxydipentyloxysilane, ethylmonomethoxydiphenyloxysilane, and ethylmonomethoxymonoethoxymonobutoxysilane; monopropylsilane compounds such as propyltrimethoxysilane, propyltriethoxysilane, propyltripentyloxysilane, propyltriphenyloxysilane, propylmonomethoxydiethoxysilane, propylmonomethoxydipropoxysilane, propylmonomethoxydipentyloxysilane, propylmonomethoxydiphenyloxysilane, propylmethoxyethoxypropoxysilane, and propylmonomethoxymonoethoxymonobutoxysilane; and monobutylsilane compounds such as butyltrimethoxysilane, butyltriethoxysilane, butyltripropoxysilane, butyltripentyloxysilane, butyltriphenyloxysilane, butylmonomethoxydiethoxysilane, butylmonomethoxydipropoxysilane, butylmonomethoxydipentyloxysilane, butylmonomethoxydiphenyloxysilane, butylmethoxyethoxypropoxysilane, and butylmonomethoxymonoethoxymonobutoxysilane. Among them, methyltrimethoxysilane and methyltriethoxysilane are preferable, and methyltrimethoxysilane is more preferable.

Specific examples of the bifunctionalsilane compound include dimethoxysilane, diethoxysilane, dipropoxysilane, dipentyloxysilane, diphenyloxysilane, methoxyethoxysilane, methoxypropoxysilane, methoxypentyloxysilane, methoxyphenyloxysilane, ethoxypropoxysilane, ethoxypentyloxysilane, ethoxyphenyloxysilane, methyldimethoxysilane, methylmethoxyethoxysilane, methyldiethoxysilane, methylmethoxypropoxysilane, methylmethoxypentyloxysilane, methylmethoxyphenyloxysilane, ethyldipropoxysilane, ethylmethoxypropoxysilane, ethyldipentyloxysilane, ethyldiphenyloxysilane, propyldimethoxysilane, propylmethoxyethoxysilane, propylethoxypropoxysilane, propyldiethoxysilane, propyldipentyloxysilane, propyldiphenyloxysilane, butyldimethoxysilane, butylmethoxyethoxysilane, butyldiethoxysilane, butylethoxypropoxysilane, butyldipropoxysilane, butylmethyldipentyloxysilane, butylmethyldiphenyloxysilane, dimethyldimethoxysilane, dimethylmethoxyethoxysilane, dimethyldiethoxysilane, dimethyldipentyloxysilane, dimethyldiphenyloxysilane, dimethylethoxypropoxysilane, dimethyldipropoxysilane, diethyldimethoxysilane, diethylmethoxypropoxysilane, diethyldiethoxysilane, diethylethoxypropoxysilane, dipropyldimethoxysilane, dipropyldiethoxysilane, dipropyldipentyloxysilane, dipropyldiphenyloxysilane, dibutyldimethoxysilane, dibutyldiethoxysilane, dibutyldipropoxysilane, dibutylmethoxypentyloxysilane, dibutylmethoxyphenyloxysilane, methylethyldimethoxysilane, methylethyldiethoxysilane, methylethyldipropoxysilane, methylethyldipentyloxysilane, methylethyldiphenyloxysilane, methylpropyldimethoxysilane, methylpropyldiethoxysilane, methylbutyldimethoxysilane, methylbutyldiethoxysilane, methylbutyldipropoxysilane, methylethylethoxypropoxysilane, ethylpropyldimethoxysilane, ethylpropylmethoxyethoxysilane, dipropyldimethoxysilane, dipropylmethoxyethoxysilane, propylbutyldimethoxysilane, propylbutyldiethoxysilane, dibutylmethoxyethoxysilane, dibutylmethoxypropoxysilane, and dibutylethoxypropoxysilane. Among them, dimethoxysilane, diethoxysilane, methyldimethoxysilane, and methyldiethoxysilane are preferable.

The weight-average molecular weight of the polysiloxane contained in the binder precursor-containing liquid is preferably 1,000 to 3,000, more preferably 1,200 to 2,700, still more preferably 1,500 to 2,000. When the weight-average molecular weight of the polysiloxane is less than 1,000, the viscosity of the binder precursor-containing liquid may be too low. On the other hand, when the weight-average molecular weight is greater than 3000, the viscosity is high and application of the binder precursor-containing liquid may be difficult. The weight-average molecular weight is a value measured by gel permeation chromatography (in terms of polystyrene).

Other examples of the organometallic compound contained in the binder precursor-containing liquid include polysilazane. Polysilazanes may be represented by the general formula $(RiR_2SiNR_3)_n$, where $R_1$, $R_2$ and $R_3$ each independently represent hydrogen, alkyl, aryl, vinyl or cycloalkyl, at least one of $R_1$, $R_2$ and $R_3$ represents hydrogen, preferably all of $R_1$, $R_2$ and $R_3$ represent hydrogen, and n represents an integer of 1 to 60. Polysilazanes may come in any molecular shape and may be for example linear or cyclic. The concentration of the polysilazane contained in the binder precursor-containing liquid is preferably 5 to 50 wt %. The concentration of polysilazane contained in the binder precursor-containing liquid is preferably higher; however, a rise in the polysilazane concentration shortens the storage life of the binder precursor-containing liquid.

The binder precursor-containing liquid may contain a reaction accelerator in addition to the organometallic compound (especially polysilazane), a light transmissive ceramic precursor. The reaction accelerator may be acid or base, for example. Specific examples of the reaction accelerator include, but not limited to, bases such as triethylamine, diethylamine, N,N-diethylethanolamine, N,N-dimethylethanolamine, triethanolamine, and triethylamine; hydrochloric acid; oxalic acid; fumaric acid; sulfonic acid; acetic acid; and metal carboxylates containing nickel, iron, palladium, iridium, platinum, titanium, or aluminum. The most preferable are metal carboxylates and are added in preferable amounts of 0.01 to 5 mol % based on polysilazane.

The binder precursor-containing liquid may contain a solvent. Examples of the solvent include aliphatic hydrocarbons, aromatic hydrocarbons, halohydrocarbons, alcohols, ethers, and esters. Preferable solvents include methylethylketone, tetrahydrofuran, benzene, toluene, xylene, dimethylfluoride, chloroform, carbontetrachloride, methylalcohol, ethylalcohol, isopropylalcohol, ethyleneglycol, propyreneglycol, 1,3-butanediol, ethyl ether, isopropyl ether, dibutyl ether, and ethyl butyl ether.

In the case where a polysiloxane solution or a polysilazane solution is contained in the binder precursor-containing liquid, application of the binder precursor-containing liquid is followed by heating of the coating at the above-mentioned curing step. The heating temperature of the coating is preferably 150 to 500° C., more preferably 150 to 350° C., from the perspective of limiting deterioration of the LED chip. In addition, when the binder precursor solution contains polysilazane, additional thermal curing after curing by irradiation with UVU radiation containing a wavelength component from 170 to 230 nm (e.g., excimer light) can enhance the effect of moisture permeation prevention of the phosphor layer.

EXAMPLES

Hereinafter, the present invention will be described in more detail with reference to Examples, which however shall not be construed as limiting the present invention. Evaluation methods in Examples will be described below.
1. Example of First Phosphor Dispersion Liquid
(1) Production of Phosphor Particles
  Production of YAG Phosphor Particles
  Yellow phosphor particles were produced in the procedure described below. Phosphor raw material having the following composition was fully mixed and loaded into an aluminum crucible followed by the addition of an appropriate amount of fluoride such as ammonium fluoride as flux. The loaded materials were calcined for 2 to 5 hours at 1,350 to 1,450° C. in reducing atmosphere under hydrogen containing-nitrogen gas flow to afford a calcined product having the composition $((Y_{0.72}Gd_{0.24})_3Al_5O_{12}:Ce_{0.04})$.
[Raw Material Composition]
  $Y_2O_3$ . . . 7.41 g
  $Gd_2O_3$ . . . 4.01 g
  $CeO_2$ . . . 0.63 g
  $Al_2O_3$ . . . 7.77 g
  The calcined product was pulverized, washed, separated and dried to afford a desired phosphor. The phosphor was then pulverized to produce phosphor particles of about 10 μm diameter. The phosphor was confirmed to be desired one by analyzing the composition of the phosphor particles. The emission wavelength of the phosphor for 465 nm excitation light had a peak wavelength at roughly 570 nm.
  (2) Preparation of Phosphor Dispersion Liquid
  The phosphor dispersion liquid was prepared using the following materials.
  (Phosphor Particles)
  Nitride phosphor particles: ASK-23PA (available from Nemoto & Co., Ltd.)
  Silicate phosphor particles: SSE (available from Lumitech Co., Ltd.)
  (Laminar Clay Mineral)
  Laminar Clay Mineral A: (synthetic mica) Micromica MK-100 (available from CO-OP CHEMICAL CO., LTD)
  Laminar clay mineral B: (smectite) Lucentite SWN (CO-OP CHEMICAL CO., LTD)
  Laminar clay mineral C: (montmorillonite) Kunipia F (available from KUNIMINE Industry Co., Ltd.)
  Laminar clay mineral D: (bentonite) BEN-GEL HVP (available from Hojun Corporation)
  (Granular Inorganic Particles)
  Silica A: (silica) AEROSIL RX300 (available from Nippon Aerosil Co., Ltd.)
  Silica B: (silica) SILYSIA 470 (available from Fuji Silysia Chemical Ltd)
  Silica C: (silica) VM-2270 (available from Dow Corning Toray Co., Ltd.)
  Silica D: (silica) Microbead SP-1 (available from Nikki Chemical Co. Ltd.)
  Silica E: (silica) Nipsil SS-50F (available from Tosoh Silica Corporation)
  Alumina: AEROXIDE Alu-C (available from Nippon Aerosil Co., Ltd.)
  (Organic Solvent of Dispersion Solvent)
  GL: glycerin
  EG: ethylene glycol
  PG: propyrene glycol
  EtOH: ethanol
  1,3-BD: 1,3-butanediol
  iso-PrOH: isopropylalcohol
  (2.1) Sample 1
  YAG phosphor particles (100 parts by weight), Micromica MK-100 (3 parts by weight), and RX 300 (3 parts by weight) were added in a mixed solvent of glycerin (80 parts by weight), 1,3-butanediol (20 parts by weight) and isopropylalcohol (50 parts by weight). The mixture was mixed using Cleamix (available from M Technique Co., Ltd.) at 8,000 rpm for 100 minutes to prepare a phosphor dispersion liquid.
  (2.2) Sample 2
  YAG phosphor particles (100 parts by weight), Micromica MK-100 (3 parts by weight) and RX300 (4 parts by weight) were added in a mixed solvent of glycerin (70 parts by weight), 1,3-butanediol (30 parts by weight) and isopropylalcohol (60 parts by weight). The mixture was mixed using TK Homomixer MARKII Model 2.5 (available from PRIMIX Corporation) at 8,000 rpm for 30 minutes to prepare a phosphor dispersion liquid.
  (2.3) Sample 3
  YAG phosphor particles (100 parts by weight), Lucentite SWN (4 parts by weight) and VM2270 (2 parts by weight) were added in a mixed solvent of glycerin (90 parts by weight) and isopropylalcohol (70 parts by weight). The mixture was mixed using FilMix FM80-50 (available from PRIMIX Corporation) at a circumferential velocity of 40 m/s for 180 minutes to prepare a phosphor dispersion liquid.
  (2.4) Sample 4
  Nitride phosphor particles (100 parts by weight), Kunipia F (3 parts by weight) and RX300 (3 parts by weight) were added in a mixed solvent of 1,3-butanediol (80 parts by weight) and ethanol (20 parts by weight). The mixture was mixed using FilMix FM80-50 (available from PRIMIX Corporation) at a circumferential velocity of 20 m/s for 30 minutes to prepare a phosphor dispersion liquid.
  (2.5) Sample 5
  Silicate phosphor particles (100 parts by weight), Micromica MK-100 (2.5 parts by weight) and SILYSIA 470 (3 parts by weight) were added in a mixed solvent of 1,3-butanediol (80 parts by weight) and isopropylalcohol (30 parts by weight). The mixture was passed through Star Burst Mini (available from Sugino Machine K.K.) 30 times at a process pressure of 100 MPa to prepare a phosphor dispersion liquid.
  (2.6) Sample 6
  YAG phosphor particles (100 parts by weight), BEN-GEL HVP (2 parts by weight) and SP-1 (4 parts by weight) were added in a mixed solvent of propyrene glycol (90 parts by weight) and isopropylalcohol (30 parts by weight). The mixture was mixed using ULTRA-TURRAX T50 (available from IKA CO., LTD) at 5,000 rpm for 30 minutes to prepare a phosphor dispersion liquid.
  (2.7) Sample 7
  YAG phosphor particles (100 parts by weight), Kunipia F (4 parts by weight) and SILYSIA 470 (2 parts by weight) were added in a mixed solvent of glycerin (80 parts by weight) and ethanol (20 parts by weight). The mixture was mixed using Cleamix (available from M Technique Co., Ltd.) at 15,000 rpm for 30 minutes to prepare a phosphor dispersion liquid.
  (2.8) Sample 8
  YAG phosphor particles (100 parts by weight), BEN-GEL HVP (2 parts by weight) and SS-50F (2 parts by weight) were added in a mixed solvent of 1,3-butanediol (40 parts by weight) and isopropylalcohol (80 parts by weight). The mixture was mixed using TK Homomixer MARKII Model 2.5 (available from PRIMIX Corporation) at 12,000 rpm for 300 minutes to prepare a phosphor dispersion liquid.
  (2.9) Sample 9
  YAG phosphor particles (100 parts by weight), Lucentite SWN (2 parts by weight) and VM2270 (3 parts by weight)

were added in a mixed solvent of propyrene glycol (30 parts by weight), 1,3-butanediol (30 parts by weight) and isopropylalcohol (70 parts by weight). The mixture was mixed using Cleamix (available from M Technique Co., Ltd.) at 12,000 rpm for 300 minutes to prepare a phosphor dispersion liquid.

(2.10) Sample 10

YAG phosphor particles (100 parts by weight), Micromica MK-100 (2 parts by weight) and SP-1 (3.5 parts by weight) were added in a mixed solvent of propyrene glycol (100 parts by weight) and isopropylalcohol (50 parts by weight). The mixture was mixed using TK Homomixer MARKII Model 2.5 (available from PRIMIX Corporation) at 12,000 rpm for 100 minutes to prepare a phosphor dispersion liquid.

(2.11) Sample 11

YAG phosphor particles (100 parts by weight), Micromica MK-100 (2 parts by weight) and SP-1 (3.5 parts by weight) were added in a mixed solvent of propyrene glycol (100 parts by weight) and isopropylalcohol (50 parts by weight). The mixture was mixed using TK Homomixer MARKII Model 2.5 (available from PRIMIX Corporation) at 12,000 rpm for 50 minutes to prepare a phosphor dispersion liquid.

(2.12) Sample 12

YAG phosphor particles (100 parts by weight), Micromica MK-100 (2 parts by weight) and SP-1 (3.5 parts by weight) were added in a mixed solvent of propyrene glycol (100 parts by weight) and isopropylalcohol (50 parts by weight). The mixture was mixed using TK Homomixer MARKII Model 2.5 (available from PRIMIX Corporation) at 12,000 rpm for 10 minutes to prepare a phosphor dispersion liquid.

(2.13) Sample 13

YAG phosphor particles (100 parts by weight), Lucentite SWN (3 parts by weight) and VM2270 (3 parts by weight) were added in a mixed solvent of 1,3-butanediol (100 parts by weight) and isopropylalcohol (60 parts by weight). The mixture was mixed using FilMix FM80-50 (available from PRIMIX Corporation) at a circumferential velocity of 30 m/s for 120 minutes to prepare a phosphor dispersion liquid.

(2.14) Sample 14

YAG phosphor particles (100 parts by weight), Micromica MK-100 (3 parts by weight) and SS-50F (3 parts by weight) were added in a mixed solvent of 1,3-butanediol (100 parts by weight) and isopropylalcohol (55 parts by weight). The mixture was mixed using ULTRA-TURRAX T50 (available from IKA CO., LTD) at 8,000 rpm for 120 minutes to prepare a phosphor dispersion liquid.

(2.15) Sample 15

YAG phosphor particles (100 parts by weight), BEN-GEL HVP (2 parts by weight), RX300 (2 parts by weight) and AEROXIDE Alu-C (2 parts by weight) were added in a mixed solvent of propyrene glycol (100 parts by weight) and isopropylalcohol (45 parts by weight). The mixture was mixed using an ultrasonic wave dispersion apparatus, GDS600RAT, (available from GINSEN Co., Ltd.) at an amplitude of 30 μm for 30 minutes to prepare a phosphor dispersion liquid.

(2.16) Sample 16

YAG phosphor particles (100 parts by weight), Kunipia F (1.5 parts by weight) and SILYSIA 470 (3 parts by weight) were added in a mixed solvent of propyrene glycol (100 parts by weight) and isopropylalcohol (55 parts by weight). The mixture was mixed using an ultrasonic wave dispersion apparatus, GDS600RAT, (available from GINSEN Co., Ltd.) at an amplitude of 30 μm for 20 minutes to prepare a phosphor dispersion liquid.

(2.17) Sample 17

YAG phosphor particles (100 parts by weight), Micromica MK-100 (3 parts by weight) and SP-1 (3 parts by weight) were added in a mixed solvent of propyrene glycol (120 parts by weight) and isopropylalcohol (70 parts by weight). The mixture was passed through Nanomizer NM-L200 (available from Yoshida Kogyosha Co., Ltd.) 20 times at a process pressure of 20 MPa to prepare a phosphor dispersion liquid.

(2.18) Sample 18

YAG phosphor particles (100 parts by weight), Micromica MK-100 (3 parts by weight) and SP-1 (3 parts by weight) were added in a mixed solvent of propyrene glycol (120 parts by weight) and isopropylalcohol (70 parts by weight). The mixture was passed through Nanomizer NM-L200 (available from Yoshida Kogyosha Co., Ltd.) 20 times at a process pressure of 60 MPa to prepare a phosphor dispersion liquid.

(2.19) Sample 19

YAG phosphor particles (100 parts by weight), Micromica MK-100 (3 parts by weight) and SP-1 (3 parts by weight) were added in a mixed solvent of propyrene glycol (120 parts by weight) and isopropylalcohol (70 parts by weight). The mixture was passed through Nanomizer NM-L200 (available from Yoshida Kogyosha Co., Ltd.) 20 times at a process pressure of 80 MPa to prepare a phosphor dispersion liquid.

(2.20) Sample 20

YAG phosphor particles (100 parts by weight), Micromica MK-100 (3 parts by weight) and SP-1 (3 parts by weight) were added in a mixed solvent of propyrene glycol (120 parts by weight) and isopropylalcohol (70 parts by weight). The mixture was passed through Nanomizer NM-L200 (available from Yoshida Kogyosha Co., Ltd.) 300 times at a process pressure of 180 MPa to prepare a phosphor dispersion liquid.

(2.21) Sample 21

YAG phosphor particles (100 parts by weight), Lucentite SWN (2 parts by weight) and SS-50F (3 parts by weight) were added in a mixed solvent of ethylene glycol (80 parts by weight) and isopropylalcohol (60 parts by weight). The mixture was passed through Star Burst Mini (available from Sugino Machine K.K.) 30 times at a process pressure of 100 MPa to prepare a phosphor dispersion liquid.

(2.22) Sample 22

YAG phosphor particles (100 parts by weight), Kunipia F (2 parts by weight) and SP-1 (3 parts by weight) were added in a mixed solvent of ethylene glycol (100 parts by weight) and ethanol (40 parts by weight). The mixture was passed through Nanomizer NM-L200 (available from Yoshida Kogyosha Co., Ltd.) 10 times at a process pressure of 20 MPa to prepare a phosphor dispersion liquid.

(2.23) Sample 23

YAG phosphor particles (100 parts by weight), BEN-GEL HVP (2 parts by weight) and SS-50F (2 parts by weight) were added in a mixed solvent of propyrene glycol (120 parts by weight) and ethanol (65 parts by weight). The mixture was passed through Nanomizer NM-L200 (available from Yoshida Kogyosha Co., Ltd.) 5 times at a process pressure of 20 MPa to prepare a phosphor dispersion liquid.

TABLE 1

| | Liquid Composition (part by weight) | | | | | | | | | | | | |
|---|---|---|---|---|---|---|---|---|---|---|---|---|---|
| | Phosphor | | | Clay mineral particles | | | | Inorganic Particles | | | | | |
| | | | | | | | | Silica | | | | | |
| | YAG | Nitride | Silicate | A | B | C | D | A | B | C | D | E | Alumina |
| Sample 1 | 100 | | | 3 | | | | 3 | | | | | |
| Sample 2 | 100 | | | 3 | | | | 4 | | | | | |
| Sample 3 | 100 | | | | 4 | | | | | 2 | | | |
| Sample 4 | | 100 | | | | 3 | | 3 | | | | | |
| Sample 5 | | | 100 | 2.5 | | | | | 3 | | | | |
| Sample 6 | 100 | | | | | | 2 | | | | 4 | | |
| Sample 7 | 100 | | | | 4 | | | | 2 | | | | |
| Sample 8 | 100 | | | | | | 2 | | | | | 2 | |
| Sample 9 | 100 | | | | | 2 | | | | 3 | | | |
| Sample 10 | 100 | | | 2 | | | | | | | 3.5 | | |
| Sample 11 | 100 | | | 2 | | | | | | | 3.5 | | |
| Sample 12 | 100 | | | 2 | | | | | | | 3.5 | | |
| Sample 13 | 100 | | | | 3 | | | | | 3 | | | |
| Sample 14 | 100 | | | 3 | | | | | | | | 3 | |
| Sample 15 | 100 | | | | | | 2 | 2 | | | | | 2 |
| Sample 16 | 100 | | | | | 1.5 | 2 | | 3 | | | | |
| Sample 17 | 100 | | | 3 | | | | | | | 3 | | |
| Sample 18 | 100 | | | 3 | | | | | | | 3 | | |
| Sample 19 | 100 | | | 3 | | | | | | | 3 | | |
| Sample 20 | 100 | | | 3 | | | | | | | 3 | | |
| Sample 21 | 100 | | | | | 2 | | | | | | 3 | |
| Sample 22 | 100 | | | | | 2 | | | | | 3 | | |
| Sample 23 | 100 | | | | | | 2 | | | | 2 | | |

| | Liquid Composition (part by weight) | | | | | | Dispersion | |
|---|---|---|---|---|---|---|---|---|
| | Solvent | | | | | | Dispersion Apparatus | Dispersion Condition |
| | GL | EG | PG | 1,3-BD | EtOH | iso-PrOH | | |
| Sample 1 | 80 | | | 20 | | 50 | Cleamix | 8,000 rpm, 100 minutes |
| Sample 2 | 70 | | | 30 | | 60 | TK Homomixer | 8,000 rpm, 30 minutes |
| Sample 3 | 90 | | | | | 70 | FilMix | Circumferential Velocity of 40 m/s, 180 minutes |
| Sample 4 | | | | 80 | 20 | | FilMix | Circumferential Velocity of 20 m/s, 30 minutes |
| Sample 5 | | | | 80 | | 30 | Star Burst | 100 MPa, 30 times |
| Sample 6 | | | 90 | | | 30 | ULTRA-TURRAX | 5,000 rpm, 30 minutes |
| Sample 7 | 80 | | | | 20 | | Cleamix | 15,000 rpm, 30 minutes |
| Sample 8 | | | | 40 | | 80 | TK Homomixer | 12,000 rpm, 300 minutes |
| Sample 9 | | 30 | 30 | | | 70 | Cleamix | 12,000 rpm, 300 minutes |
| Sample 10 | | | 100 | | | 50 | TK Homomixer | 12,000 rpm, 100 minutes |
| Sample 11 | | | 100 | | | 50 | TK Homomixer | 12,000 rpm, 50 minutes |
| Sample 12 | | | 100 | | | 50 | TK Homomixer | 12,000 rpm, 10 minutes |
| Sample 13 | | | | 100 | | 60 | FilMix | Circumferential Velocity of 30 m/s, 120 minutes |
| Sample 14 | | | | 100 | | 55 | ULTRA-TURRAX | 8,000 rpm, 120 minutes |
| Sample 15 | | | 100 | | | 45 | Ultrasonic Waves Dispersion | Amplitude 30 μm, 30 minutes |
| Sample 16 | | | 100 | | | 55 | Ultrasonic Waves Dispersion | Amplitude 30 μm, 20 minutes |
| Sample 17 | | | 120 | | | 70 | Nanomizer | 20 MPa, 20 times |
| Sample 18 | | | 120 | | | 70 | Nanomizer | 60 MPa, 20 times |
| Sample 19 | | | 120 | | | 70 | Nanomizer | 80 MPa, 20 times |
| Sample 20 | | | 120 | | | 70 | Nanomizer | 180 MPa, 300 times |
| Sample 21 | | 80 | | | | 60 | Star Burst | 100 MPa, 30 times |

TABLE 1-continued

| Sample 22 | 100 | | 40 | Nanomizer | 20 MPa, 10 times |
| Sample 23 | | 120 | 65 | Nanomizer | 20 MPa, 5 times |

(3) Evaluation of Phosphor Dispersion Liquid

For each of the phosphor dispersion liquids obtained in the above-mentioned manner (samples 1 to 23), a viscosity measurement, evaluation of variation in chromaticity in the same substrate, evaluation of variation in chromaticity between substrates, and evaluation of nozzle clogging were carried out.

Measurement of Viscosity

The viscosity was measured using RheoStress RS600 available from Haake, Inc. A parallel plate sensor having a diameter of 60 mm was used. The gap (the space between upper and lower plates) was set at 0.15 mm and the temperature was set at 25° C. The amount of the sample per measurement was 2 cc. In the flow curve mode, the viscosity was measured at ten points at even intervals from a shear rate of 0.1 (1/s) as the starting point to a shear rate of 100,000 (1/s), to make a graph of the relationship between the shear rate and the viscosity. The retention time at each shear rate (the period from the change of the shear rate until the restart of the measurement) was one minute. Viscosity $\eta 1$ at the shear rate of 1,000 (1/s), and viscosity $\eta 2$ at the shear rate of 1 (1/s) were found from the graph made in the above-mentioned manner, and were employed as measurement values. The $\eta 1$ and $\eta 2$ are shown in Table 2.

Variation in Chromaticity in the Same Substrate

The phosphor dispersion liquids of Examples and Comparative Examples immediately after the preparation and the above-mentioned binder precursor-containing liquid were applied in the following manner, to manufacture LED devices.

One substrate (LED chip package) on which 64 LED chips in 8 rows by 8 columns are mounted was prepared. On the LED chip package thus prepared, the phosphor dispersion liquid was applied using a sprayer under a certain condition (see FIG. 3). The applied amount of the phosphor dispersion liquid was 1 to 2 ml per substrate. This substrate was heated at 150° C. for 1 hour. Next, the binder precursor-containing liquid was applied on the substrate under a certain condition. The applied amount of the binder precursor-containing liquid was 1 to 2 ml. The coating of the phosphor dispersion liquid and the binder precursor-containing liquid was heated at 150° C. for 1 hour to cure the ceramic precursor, whereby a phosphor layer was obtained.

The binder precursor-containing liquid was a mixed solvent of 15 parts by weight of tetramethoxysilane KBM04 (available from Shin-Etsu Chemical Co., Ltd.), 5 parts by weight of methyltrimethoxysilane KBM13 (available from Shin-Etsu Chemical Co., Ltd.), 40 parts by weight of isopropylalcohol, 40 parts by weight of ethanol, and 2 parts by weight of hydrochloric acid.

The chromaticities of light emitted from respective 64 LED chips formed on the LED chip package, in other words, the chromaticity of the synthetic light of the light emitted from each LED chip and the fluorescence emitted from the phosphor layer formed on the LED chip, were measured, and the x value and y value of the chromaticity in the CIE color system were determined Chromaticity measurements were done using spectroradiometer CS-1000A (Konica Minolta Sensing, Inc.). The chromaticity is defined by a point where a straight line connecting a certain point to the origin crosses the plane x+y+z=1 in the CIE-XYZ color system in which color space is represented by the XYZ coordinate system.

Next, the variation (standard deviation) of the above-mentioned 64×values was calculated. The standard deviation thus calculated was used to evaluate the variation in chromaticity in the same substrate, based on the following criteria.

A (preferable for practical use): The standard deviation was equal to or smaller than 0.01

B (allowable for practical use): The standard deviation was greater than 0.01 and equal to or smaller than 0.02

C (not preferable for practical use): The standard deviation was greater than 0.02

Evaluation of Variation in Chromaticity among Substrates 50 substrates (LED chip packages) each have 64 LED chips in 8 rows by 8 columns mounted thereon were prepared. In the same manner as the "evaluation of variation in chromaticity in the same substrate," 50 LED devices were manufactured.

The chromaticities of the light emitted from respective 64 LED chips mounted on the 10th LED chip package (substrate 10); in other words, the chromaticity of the synthetic light of the light emitted from each LED chip and the fluorescence emitted from the phosphor layer formed on the LED chip, were measured, and the x value and y value of the chromaticity in the CIE color system were determined. Then, the average value of the x values (64×values) was calculated.

Likewise, the average value of the x values (64×values) was calculated for 64 LED chips formed on each of the 20th LED chip package (substrate 20), the 30th LED chip package (substrate 30), the 40th LED chip package (substrate 40), and the 50th LED chip package (substrate 50). Then, the standard deviation was calculated based on the average values of the x values of each of the substrates (substrate 10, substrate 20, substrate 30, substrate 40 and substrate 50). The standard deviation thus calculated was used to evaluate the variation in chromaticity among the substrates, based on the following criteria.

A (preferable for practical use): The standard deviation was equal to or smaller than 0.01

B (slightly not allowable for practical use): The standard deviation was greater than 0.01 and equal to or smaller than 0.015

C (not preferable for practical use): The standard deviation was greater than 0.015

Evaluation of Nozzle Clogging

An operation was repeated in which, after spraying the phosphor dispersion liquid, the spraying is stopped for a certain period before resuming the spraying. The suspension period was extended on 5 minute basis, and the time it takes before the nozzle clogging, in other words, a state where jetting cannot be performed, occurred was measured.

A (preferable for practical use): No nozzle clogging occurred when the spraying was resumed after stopping the splaying for 1 hour B (allowable for practical use): Nozzle clogging occurred when the spraying was resumed after stopping the splaying for 30 minutes C (not preferable for practical use): Nozzle clogging occurred when the spraying was resumed after stopping the splaying for 5 minutes

TABLE 2

| | | Viscosity Measurement Result (mPa·s) | | Evaluation of Spray Performance and Chromaticity | | |
|---|---|---|---|---|---|---|
| | | $\eta 1$ V = 1,000 (1/s) | $\eta 2$ V = 1 (1/s) | Nozzle Clogging | Color Non-uniformity in the Same Substrate | Variation in Chromaticity among multiple Substrates |
| Comp Ex. 1 | Sample 1 | 1,000 | 10,000 | A | C | C |
| Comp Ex. 2 | Sample 2 | 1,000 | 1,000 | A | C | C |
| Comp Ex. 3 | Sample 3 | 500 | 200,000 | C | — | — |
| Ex. 1 | Sample 4 | 100 | 4,000 | A | A | A |
| Ex. 2 | Sample 5 | 500 | 10,000 | A | B | A |
| Ex. 3 | Sample 6 | 500 | 1,000 | A | B | B |
| Comp Ex. 4 | Sample 7 | 500 | 500 | A | B | C |
| Comp Ex. 5 | Sample 8 | 200 | 200,000 | C | — | — |
| Ex. 4 | Sample 9 | 200 | 100,000 | B | A | A |
| Ex. 5 | Sample 10 | 150 | 10,000 | A | A | A |
| Ex. 6 | Sample 11 | 150 | 4,000 | A | A | A |
| Comp Ex. 6 | Sample 12 | 150 | 800 | A | A | C |
| Ex. 7 | Sample 13 | 300 | 30,000 | A | A | A |
| Ex. 8 | Sample 14 | 200 | 10,000 | A | A | A |
| Ex. 9 | Sample 15 | 200 | 1,000 | A | A | B |
| Comp Ex. 7 | Sample 16 | 200 | 500 | A | A | C |
| Ex. 10 | Sample 17 | 10 | 1,200 | A | A | A |
| Ex. 11 | Sample 18 | 40 | 2,000 | A | A | A |
| Ex. 12 | Sample 19 | 80 | 2,500 | A | A | A |
| Comp Ex. 8 | Sample 20 | 800 | 100,000 | B | C | C |
| Ex. 13 | Sample 21 | 10 | 1,000 | A | A | B |
| Comp Ex. 9 | Sample 22 | 10 | 500 | A | A | C |
| Comp Ex. 10 | Sample 23 | 5 | 300 | A | A | C |

Referring to Comparative Examples 1, 2 and 8 in Table 2, when viscosity $\eta 1$ of the phosphor dispersion liquid at a shear rate of 1,000 (1/s) was greater than 500 mPa·s, color non-uniformity occurred in the same substrate. One possible reason for this is that the jetting with the sprayer became non-uniform, and the thickness of the phosphor dispersion liquid varied in the same substrate.

In addition, referring to Comparative Examples 4, 6, 7, 9 and 10 in Table 2, when viscosity $\eta 2$ of the phosphor dispersion liquid at a shear rate of 1 (1/s) was lower than 1,000 mPa·s, the chromaticity of emission light varied among the substrates. One possible reason for this is that the phosphor particles settled down in the applicator. On the other hand, referring to Comparative Examples 3 and 5, when viscosity $\eta 2$ was greater than $1.0 \times 10^5$ mPa·, nozzle clogging occurred, and spraying could not be performed.

Next, comparing Examples 5 and 6 with Comparative Example 6, viscosity $\eta 2$ was low in Comparative Example 6 although the compositions thereof were the same, and as a result the chromaticity of emitted light varied among the substrates. One possible reason for this is that the stirring time for the mixture was not sufficient, and the anti-settlement effect of the clay mineral particles was not sufficiently exercised.

In addition, the compositions of Examples 10 to 12 and Comparative Example 8 were also the same. However, in Comparative Example 8, viscosity $\eta 1$ was high, and color non-uniformity occurred in the same substrate. In Comparative Example 8, the chromaticity varied among the substrates. One possible reason for this is that the shearing force at the time of mixing the phosphor dispersion liquid was too large. That is, by adjusting the dispersion time at the time of mixing the phosphor dispersion liquid and the shearing force at the time of dispersing, a phosphor dispersion liquid having a desired viscosity is obtained.

2. Examples of Second Phosphor Dispersion Liquid
  (1) Preparation of Phosphor Particles
  The phosphor particles were prepared in the same manner as the phosphor particles used for the first dispersion liquid.
  (2) Preparation of Phosphor Dispersion Liquid
  The following raw materials were used to prepare the phosphor dispersion liquid.
(Organic Solvent of Dispersion Solvent)
  EG: ethylene glycol
  PG: propyrene glycol
  EtOH: ethanol
  1,3-BD: 1,3-butanediol
  iso-PrOH: isopropylalcohol
(Clay Mineral Particles)
  Clay mineral a: (Smectite) Lucentite SWN (available from CO-OP CHEMICAL CO., LTD)
  Clay mineral b: (Montmorillonite) Kunipia F (available from KUNIMINE Industry Co., Ltd.)
  Clay mineral c: (Bentonite) BEN-GEL HVP (available from Hojun Corporation)
  Clay mineral d: (Synthetic mica) Micromica MK-100 (available from CO-OP CHEMICAL CO., LTD)
  Clay mineral e: (Hectorite) Laponite XLG (available from LaPorte Co., UK) (Inorganic particles)
  Inorganic particles a: (silica) AEROSIL RX300 (available from Nippon Aerosil Co., Ltd.)
  Inorganic particles b: (silica) AEROSIL 200 (available from Nippon Aerosil Co., Ltd.)
  Inorganic particles c: (silica) SILYSIA 470 (available from Fuji Silysia Chemical Ltd.)
  Inorganic particles d: (silica) Nipsil SS-50F (available from Tosoh Silica Corporation)
  Inorganic particles e: (silica) SUNLOVELY (available from AGC Si-Tech. Co., Ltd.)
  Inorganic particles f: (alumina) AEROXIDE Alu-C (available from Nippon Aerosil Co., Ltd.)

(2.1) Sample 1

The phosphor particles (42 parts by weight), Lucentite SWN (2 parts by weight) and SILYSIA 470 (2 parts by weight) were added in a mixed solvent of 1,3-butanediol (31.8 parts by weight), isopropylalcohol (18 parts by weight) and water (4.2 parts by weight). The resulting mixture was mixed using Auto Homomixer to prepare a phosphor dispersion liquid.

(2.2) Sample 2

The phosphor particles (42 parts by weight), Lucentite SWN (2 parts by weight) and SILYSIA 470 (2 parts by weight) were added in a mixed solvent of 1,3-butanediol (32 parts by weight), isopropylalcohol (18 parts by weight) and water (4 parts by weight). The resulting mixture was mixed using Auto Homomixer to prepare a phosphor dispersion liquid.

(2.3) Sample 3

The phosphor particles (42 parts by weight), Lucentite SWN (2 parts by weight) and SILYSIA 470 (2 parts by weight) were added in a mixed solvent of 1,3-butanediol (34 parts by weight), isopropylalcohol (18 parts by weight) and water (2 parts by weight). The resulting mixture was mixed using Auto Homomixer to prepare a phosphor dispersion liquid.

(2.4) Sample 4

The phosphor particles (42 parts by weight), Lucentite SWN (2 parts by weight) and SILYSIA 470 (2 parts by weight) were added in a mixed solvent of 1,3-butanediol (35 parts by weight), isopropylalcohol (18 parts by weight) and water (1 part by weight). The resulting mixture was mixed using Auto Homomixer to prepare a phosphor dispersion liquid.

(2.5) Sample 5

The phosphor particles (42 parts by weight), Lucentite SWN (2 parts by weight) and SILYSIA 470 (2 parts by weight) were added in a mixed solvent of 1,3-butanediol (35.9 parts by weight), isopropylalcohol (18 parts by weight) and water (0.1 parts by weight). The resulting mixture was mixed using Auto Homomixer to prepare a phosphor dispersion liquid.

(2.6) Sample 6

The phosphor particles (42 parts by weight), Lucentite SWN (2 parts by weight) and SILYSIA 470 (2 parts by weight) were added in a mixed solvent of 1,3-butanediol (35.92 parts by weight), isopropylalcohol (18 parts by weight) and water (0.08 parts by weight). The resulting mixture was mixed using Auto Homomixer to prepare a phosphor dispersion liquid.

(2.7) Sample 7

The phosphor particles (35 parts by weight), Micromica MK-100 (1.5 parts by weight) and AEROSIL RX300 (1.5 parts by weight) were added in a mixed solvent of glycerin (40 parts by weight), ethanol (20 parts by weight) and water (2 parts by weight). The resulting mixture was mixed using ULTRA-TURRAX to prepare a phosphor dispersion liquid.

(2.8) Sample 8

The phosphor particles (35 parts by weight), Micromica MK-100 (1.5 parts by weight) and AEROSIL RX300 (1.5 parts by weight) were added in a mixed solvent of ethyleneglycol (40 parts by weight), ethanol (20 parts by weight) and water (2 parts by weight). The resulting mixture was mixed using Apex Mill to prepare a phosphor dispersion liquid.

(2.9) Sample 9

The phosphor particles (35 parts by weight), Micromica MK-100 (1.5 parts by weight) and AEROSIL RX300 (1.5 parts by weight) were added in a mixed solvent of propyreneglycol (40 parts by weight), isopropylalcohol (20 parts by weight) and water (2 parts by weight). The resulting mixture was mixed using FilMix to prepare a phosphor dispersion liquid.

(2.10) Sample 10

The phosphor particles (35 parts by weight), Micromica MK-100 (1.5 parts by weight) and AEROSIL RX300 (1.5 parts by weight) were added in a mixed solvent of 1,3-butanediol (40 parts by weight), isopropylalcohol (20 parts by weight) and water (2 parts by weight). The resulting mixture was mixed using Auto Homomixer to prepare a phosphor dispersion liquid.

(2.11) Sample 11

The phosphor particles (40 parts by weight), Kunipia F (2 parts by weight) and AEROSIL 200 (2 parts by weight) were added in a mixed solvent of 1,3-butanediol (35 parts by weight), isopropylalcohol (20 parts by weight) and water (1 part by weight). The resulting mixture was mixed using FilMix to prepare a phosphor dispersion liquid.

(2.12) Sample 12

The phosphor particles (40 parts by weight), BEN-GEL HVP (2 parts by weight) and SILYSIA 470 (2 parts by weight) were added in a mixed solvent of 1,3-butanediol (35 parts by weight), isopropylalcohol (20 parts by weight) and water (1 part by weight). The resulting mixture was mixed using FilMix to prepare a phosphor dispersion liquid.

(2.13) Sample 13

The phosphor particles (40 parts by weight), Micromica MK-100 (2 parts by weight) and Nipsil SS-50F (2 parts by weight) were added in a mixed solvent of 1,3-butanediol (35 parts by weight), isopropylalcohol (20 parts by weight) and water (1 part by weight). The resulting mixture was mixed using FilMix to prepare a phosphor dispersion liquid.

(2.14) Sample 14

The phosphor particles (40 parts by weight), Laponite XLG (2 parts by weight) and SUNLOVELY (2 parts by weight) were added in a mixed solvent of 1,3-butanediol (35 parts by weight), isopropylalcohol (20 parts by weight) and water (1 part by weight). The resulting mixture was mixed using FilMix to prepare a phosphor dispersion liquid.

(2.15) Sample 15

The phosphor particles (40 parts by weight), Lucentite SWN (2 parts by weight), AEROSIL 200 (1 part by weight) and AEROXIDE Alu-C (1 part by weight) were added in a mixed solvent of 1,3-butanediol (35 parts by weight), isopropylalcohol (20 parts by weight) and water (1 part by weight). The resulting mixture was mixed using FilMix to prepare a phosphor dispersion liquid.

(2.16) Sample 16

The phosphor particles (40 parts by weight), Micromica MK-100 (2 parts by weight) and Nipsil SS-50F (2 parts by weight) were added in a mixed solvent of 1,3-butanediol (34 parts by weight), isopropylalcohol (17 parts by weight) and water (5 parts by weight). The resulting mixture was mixed using FilMix to prepare a phosphor dispersion liquid.

(2.17) Sample 17

The phosphor particles (40 parts by weight), Micromica MK-100 (2 parts by weight) and Nipsil SS-50F (2 parts by weight) were added in a mixed solvent of 1,3-butanediol (36 parts by weight) and isopropylalcohol (20 parts by weight). The resulting mixture was mixed using FilMix to prepare a phosphor dispersion liquid.

(3) (Vibration) Measurement of Viscosity of Samples

The viscosities of the phosphor dispersion liquids of Samples 1 to 17 at 25° C. were measured using vibration viscometer (VM-10A-L available from CBC). The measurement results are shown in Table 3.

(4) Measurement of Viscosity (η1 and η2) of Samples

The viscosity was measured using RheoStress RS600 available from Haake, Inc. A parallel plate sensor having a diameter of 60 mm was used. The gap (the space between upper and lower plates) was set at 0.15 mm and the temperature was set at 25° C. The amount of sample per measurement was 2 cc. In the flow curve mode, the viscosity was measured at ten points at even intervals from a shear rate of 0.1 (1/s) as the starting point to a shear rate of 100,000 (1/s), to make a graph of the relationship between the shear rate and the viscosity. The retention time at each shear rate (the period from the change of the shear rate until the restart of the measurement) was one minute. Viscosity η1 at the shear rate of 1,000 (1/s), and viscosity η2 at the shear rate of 1 (1/s) were found from the graph made in the above-mentioned manner, and were employed as measurement values. The η1 and η2 are shown in Table 4.

TABLE 3

| Parts by Weight | Dispersion Solvent Composition | | | | | | | Clay Mineral Particles | | | | | Inorganic Particles | | | | | | Phosphor | Dispersion Apparatus | Viscosity (Vibration) | η1 V=1000 (1/s) | η2 V=1 (1/s) |
|---|---|---|---|---|---|---|---|---|---|---|---|---|---|---|---|---|---|---|---|---|---|---|---|
| | Glycerin | EG | PG | 1,3-BD | EtOH | iso-PrOH | Water | a | b | c | d | e | a | b | c | d | e | f | | | | | |
| Sample 1 | | | | 31.8 | | 18 | 4.2 | 2 | | | | | 2 | | | | | | 42 | Auto Homomixer | 240 | 140 | 110,000 |
| Sample 2 | | | | 32 | | 18 | 4 | 2 | | | | | 2 | | | | | | 42 | Auto Homomixer | 240 | 120 | 90,000 |
| Sample 3 | | | | 34 | | 18 | 2 | 2 | | | | | 2 | | | | | | 42 | Auto Homomixer | 220 | 100 | 20,000 |
| Sample 4 | | | | 35 | | 18 | 1 | 2 | | | | | 2 | | | | | | 42 | Auto Homomixer | 180 | 50 | 8,000 |
| Sample 5 | | | | 35.9 | | 18 | 0.1 | 2 | | | | | 2 | | | | | | 42 | Auto Homomixer | 160 | 20 | 2,000 |
| Sample 6 | | | | 35.92 | | 18 | 0.08 | 2 | | | | | 2 | | | | | | 42 | Auto Homomixer | 130 | 8 | 800 |
| Sample 7 | 40 | | | | 20 | | 2 | | | | 1.5 | | 1.5 | | | | | | 35 | ULTRA-TURRAX | 230 | 100 | 12,000 |
| Sample 8 | | 40 | | | 20 | | 2 | | | | 1.5 | | 1.5 | | | | | | 35 | Apex Mill | 190 | 50 | 2,000 |
| Sample 9 | | | 40 | | | 20 | 2 | | | | 1.5 | | 1.5 | | | | | | 35 | FilMix | 200 | 30 | 4,000 |
| Sample 10 | | | | 40 | | 20 | 2 | | | | 1.5 | | 1.5 | | | | | | 35 | Auto Homomixer | 200 | 60 | 2,500 |
| Sample 11 | | | | 35 | | 20 | 1 | 2 | | | | | | 2 | | | | | 40 | FilMix | 220 | 70 | 5,000 |
| Sample 12 | | | | 35 | | 20 | 1 | | 2 | | | | | 2 | | | | | 40 | FilMix | 200 | 60 | 4,000 |
| Sample 13 | | | | 35 | | 20 | 1 | | | 2 | | | | | | 2 | | | 40 | FilMix | 210 | 90 | 6,000 |
| Sample 14 | | | | 35 | | 20 | 1 | | | | 2 | | | | | | 2 | | 40 | FilMix | 200 | 60 | 1,500 |
| Sample 15 | | | | 35 | | 20 | 1 | 2 | | | | | | 1 | | | | | 40 | FilMix | 240 | 90 | 10,000 |
| Sample 16 | | | | 34 | | 17 | 5 | | 2 | | | | 2 | | | | | | | | | | |
| Sample 17 | | | | 36 | | 20 | 0 | | | | | 2 | | | | | | | | | | | |

TABLE 3-continued

| | | | | | | |
|---|---|---|---|---|---|---|
| Sample 16 | 2 | 40 | FilMix | 260 | 160 | 110,000 |
| Sample 17 | 2 | 40 | FilMix | 180 | 8 | 900 |

EG: ethylene glycol
PG: propyrene glycol
EtOH: ethanol
1,3-BD: 1,3-butanediol
iso-PrOH: isopropylalcohol
Clay Mineral a: Lucentite SWN,
Clay Mineral b: Kunipia F,
Clay Mineral c: BEN-GEL HVP,
Clay Mineral d: Micromica MK-100,
Clay Mineral e: Laponite XLG,
Inorganic Particles a: AEROSIL RX300,
Inorganic Particles b: AEROSIL 200,
Inorganic Particles c: SILYSIA 470,
Inorganic Particles d: Nipsil SS-50F,
Inorganic Particles e: SUNLOVELY,
Inorganic Particles f: AEROXIDE Alu-C (5) Preparation of Ceramic Precursor Solution 14 parts by weight of polysiloxane was dissolved in 86 parts by weight of isopropylalcohol to obtain a ceramic precursor solution.

25 substrates (LED chip packages) each having 25 LED chips disposed in 5 rows by 5 columns were prepared. On 25 LED chip packages thus prepared, the phosphor dispersion liquid and the ceramic precursor solution were sequentially applied using a sprayer (see FIG. 3) under a certain condition. Each of the phosphor dispersion liquid and the ceramic precursor solution in an amount of 0.5 to 1 ml was applied on each substrate. The coating was heated to cure the ceramic precursor, and thus a transparent ceramic was obtained.

The chromaticities of light emitted from respective 25 LED chips mounted on the 5th LED chip package (substrate 5) were measured, and the x value and the y value in the CIE color system were determined. The average value of the x values of the light emitted from the 25 LED devices, and the variation (standard deviation) of the x values of the light emitted from the 25 LED devices were calculated.

Likewise, the chromaticities of the light emitted from the 25 LED devices were measured for each of the 10th LED chip package (substrate 10), the 15th LED chip package (substrate 15), the 20th LED chip package (substrate 20), and the 25th LED chip package (substrate 25), and the x value and the y value in the CIE color system were determined. Then, the average value of the x values of the light emitted from the 25 LED devices, and the variation (standard deviation) of the x values of the light emitted from the LED devices were calculated. The results of the calculation are shown in Table 4.

Next, the standard deviations of the average values of the x values of substrate 5, substrate 10, substrate 15, substrate 20, and substrate 25 were calculated. The results of the calculation are shown in Table 4.

TABLE 4

| | | Average Value of Chromaticity and Standard Deviation in One Substrate | | | | | | | | | Standard Deviation of Average Values of |
|---|---|---|---|---|---|---|---|---|---|---|---|
| | | Substrate 5 | | Substrate 10 | | Substrate 15 | | Substrate 20 | | Substrate 25 | Substrates 5, |
| | | Average Value | Standard Deviation | Average Value | Standard Deviation | Average Value | Standard Deviation | Average Value | Standard Deviation | Average Value | Standard Deviation | 10, 15, 20, and 25 |
| Comp Ex. 1 | Sample 1 | 0.352 | 0.012 | 0.346 | 0.015 | 0.351 | 0.016 | 0.346 | 0.013 | 0.345 | 0.018 | 0.003 |
| Ex. 1 | Sample 2 | 0.345 | 0.008 | 0.346 | 0.008 | 0.341 | 0.009 | 0.352 | 0.005 | 0.345 | 0.008 | 0.004 |
| Ex. 2 | Sample 3 | 0.342 | 0.005 | 0.345 | 0.007 | 0.342 | 0.003 | 0.338 | 0.005 | 0.348 | 0.006 | 0.004 |
| Ex. 3 | Sample 4 | 0.342 | 0.006 | 0.341 | 0.005 | 0.338 | 0.007 | 0.335 | 0.005 | 0.332 | 0.006 | 0.004 |
| Ex. 4 | Sample 5 | 0.343 | 0.005 | 0.341 | 0.005 | 0.338 | 0.004 | 0.336 | 0.005 | 0.333 | 0.005 | 0.004 |
| Comp Ex. 2 | Sample 6 | 0.314 | 0.004 | 0.322 | 0.005 | 0.332 | 0.003 | 0.338 | 0.004 | 0.341 | 0.005 | 0.011 |
| Ex. 5 | Sample 7 | 0.343 | 0.005 | 0.338 | 0.006 | 0.335 | 0.006 | 0.343 | 0.004 | 0.336 | 0.005 | 0.004 |
| Ex. 6 | Sample 8 | 0.338 | 0.006 | 0.339 | 0.004 | 0.333 | 0.008 | 0.343 | 0.005 | 0.344 | 0.006 | 0.004 |
| Ex. 7 | Sample 9 | 0.351 | 0.007 | 0.345 | 0.007 | 0.351 | 0.006 | 0.345 | 0.007 | 0.346 | 0.006 | 0.003 |
| Ex. 8 | Sample 10 | 0.345 | 0.005 | 0.338 | 0.006 | 0.338 | 0.005 | 0.343 | 0.005 | 0.346 | 0.006 | 0.004 |
| Ex. 9 | Sample 11 | 0.345 | 0.005 | 0.344 | 0.005 | 0.341 | 0.003 | 0.338 | 0.004 | 0.335 | 0.005 | 0.004 |
| Ex. 10 | Sample 12 | 0.346 | 0.004 | 0.344 | 0.004 | 0.341 | 0.007 | 0.339 | 0.004 | 0.336 | 0.005 | 0.004 |
| Ex. 11 | Sample 13 | 0.343 | 0.005 | 0.344 | 0.005 | 0.339 | 0.004 | 0.35 | 0.005 | 0.343 | 0.005 | 0.004 |
| Ex. 12 | Sample 14 | 0.34 | 0.006 | 0.343 | 0.005 | 0.34 | 0.006 | 0.336 | 0.004 | 0.346 | 0.003 | 0.004 |
| Ex. 13 | Sample 15 | 0.34 | 0.005 | 0.339 | 0.004 | 0.336 | 0.005 | 0.333 | 0.005 | 0.33 | 0.007 | 0.004 |
| Comp Ex. 3 | Sample 16 | 0.341 | 0.015 | 0.339 | 0.015 | 0.336 | 0.012 | 0.334 | 0.016 | 0.331 | 0.014 | 0.004 |
| Comp Ex. 4 | Sample 17 | 0.335 | 0.008 | 0.339 | 0.006 | 0.348 | 0.008 | 0.36 | 0.007 | 0.371 | 0.009 | 0.015 |

Referring to Table 4, in Comparative Example 1 and Comparative Example 3, the variation in chromaticity (x value) of the light emitted from the LED devices on the substrate (substrate 5, substrate 10, substrate 15, substrate 20 or substrate 25) is large (standard deviation is large). One possible reason for this is that Sample 1 of Comparative Example 1 and Sample 16 of Comparative Example 3 each have a large water content, and therefore have a low wettability. It is found that application of a sample (phosphor dispersion liquid) having a low wettability resulted in the presence of LED chips on which a large amount of sample was applied and LED chips on which a small amount of sample was applied in one substrate. As a result, the supply amount of the phosphors varied among the LED devices in one substrate.

Further, referring to Table 4, in Comparative Example 2 and Comparative Example 4, the x value gradually increases in the order of substrate 5, substrate 10, substrate 15, substrate 20, and substrate 25. This result indicates that the concentration of the phosphors in the applied phosphor dispersion liquid gradually increased in the order of substrate 5, substrate 10, substrate 15, substrate 20, and substrate 25. The reason for this is that the phosphor particles in the phosphor dispersion liquid contained in the coating solution tank in the sprayer gradually settled down, and the phosphor concentration of the phosphor dispersion liquid applied with the sprayer gradually varied (in this case, the phosphor concentration gradually increased).

In contrast, in the Examples, variation (standard deviation) in chromaticity (x value) of the light emitted from the LED devices was smaller than 0.01 in each of the substrates, and it is found that the variation was limited. Further, the variation (standard deviation) of the average value of substrate 5, the average value of substrate 10, the average value of substrate 15, the average value of substrate 20 and the average value of substrate 25 was equal to or smaller than 0.004, and it is found that the variation was limited.

INDUSTRIAL APPLICABILITY

In the phosphor dispersion liquid of the present invention, the phosphor particles do not easily settle down in the applicator, and further the phosphor dispersion liquid of the present invention achieves favorable discharging from the applicator. Consequently, coloring and color non-uniformity do not occur in the light emitted from an LED device, and further the chromaticity of the light emitted from multiple LED devices is uniform. Therefore, the LED device manufactured using the phosphor dispersion liquid of the present invention is suitable for use in various kinds of lighting apparatuses for indoor or outdoor use, such as store lighting systems which require uniform chromaticity of emission light.

REFERENCE SIGNS LIST

1 LED Chip
2 Package
3 Metal Part
4 Bump Electrode
5 Phosphor Layer
100 LED Device

The invention claimed is:

1. A phosphor dispersion liquid comprising phosphor particles, clay mineral particles, inorganic particles, and a solvent, the phosphor dispersion liquid having
viscosity $\eta 1$ of 10 mPa·s to 500 mPa·s at a shear rate of 1,000 (1/s) at 25° C., and
viscosity $\eta 2$ of $1.0 \times 10^3$ mPa·s to $1.0 \times 10^5$ mPa·s at a shear rate of 1 (1/s) at 25° C.

2. The phosphor dispersion liquid according to claim 1, wherein the clay mineral particles are a laminar silicate mineral.

3. The phosphor dispersion liquid according to claim 1, wherein the solvent includes a monohydric alcohol and a polyol.

4. A method of manufacturing a light emitting devive (LED) device, the LED device including a LED chip and a phosphor layer that covers the LED chip and converts light having a predetermined wavelength emitted from the LED chip into light having another predetermined wavelength, the method comprising:
providing the LED;
applying the phosphor dispersion liquid according to claim 1 on the LED chip;
applying on the LED chip a binder precursor-containing liquid containing a light transmissive binder precursor; and
curing the light transmissive binder precursor.

5. The method according to claim 4, wherein the light transmissive binder precursor is a light transmissive ceramic precursor.

6. A phosphor dispersion liquid comprising phosphor particles, clay mineral particles, inorganic particles, and a dispersion solvent containing water and an organic solvent, wherein
a content of the water is 0.1 wt % to 4 wt %.

7. The phosphor dispersion liquid according to claim 6, wherein the phosphor dispersion liquid has a viscosity of 60 mPa·s to 400 mPa·s as measured using a vibration viscometer at 25° C.

8. The phosphor dispersion liquid according to claim 6, wherein the organic solvent includes a monohydric alcohol and a polyol.

9. A method of manufacturing a light emitting device (LED) chip, comprising:
providing an LED chip; and
forming a phosphor layer by applying the phosphor dispersion liquid according to claim 6 on an emission surface of the LED chip.

10. The method according to claim 9, further comprising applying a solution including an organometallic compound on the emission surface of the LED chip.

11. The method according to claim 9, wherein
the phosphor dispersion liquid is applied using a spray applicator, and
the spray applicator includes a coating solution tank for storing therein the phosphor dispersion liquid, a head having a nozzle for discharging the phosphor dispersion liquid, and a connector tube for allowing communication between the coating solution tank and the head.

12. The method according to claim 9, wherein the LED device is a white LED device.

13. A phosphor dispersion liquid comprising phosphor particles, clay mineral particles, inorganic particles, and a solvent,
the solvent including water,
a content of the water being 0.1 wt % to 4 wt % of a total amount of the phosphor dispersion liquid,
the phosphor dispersion liquid having
viscosity $\eta 1$ of 10 mPa·s to 500 mPa·s at a shear rate of 1,000 (1/s) at 25° C., and
viscosity $\eta 2$ of $1.0 \times 10^3$ mPa·s to $1.0 \times 10^5$ mPa·s at a shear rate of 1 (1/s) at 25° C.

* * * * *